(12) United States Patent
Akins et al.

(10) Patent No.: US 7,087,914 B2
(45) Date of Patent: Aug. 8, 2006

(54) HIGH REPETITION RATE LASER PRODUCED PLASMA EUV LIGHT SOURCE

(75) Inventors: Robert P. Akins, Escondido, CA (US); Richard L. Sandstrom, Encinitas, CA (US); William N. Partlo, Poway, CA (US); Igor V. Fomenkov, San Diego, CA (US); John Martin Algots, San Diego, CA (US); Robert N. Jacques, La Jolla, CA (US); Frederick Palenschat, Lemon Grove, CA (US); Jun Song, San Diego, CA (US)

(73) Assignee: Cymer, INC, San Diego, CA (US)

( * ) Notice: Subject to any disclaimer, the term of this patent is extended or adjusted under 35 U.S.C. 154(b) by 145 days.

(21) Appl. No.: 10/803,526

(22) Filed: Mar. 17, 2004

(65) Prior Publication Data

US 2005/0205810 A1   Sep. 22, 2005

(51) Int. Cl.
*H01J 35/20* (2006.01)

(52) U.S. Cl. .............................. 250/504 R; 250/493.1; 378/119

(58) Field of Classification Search ............ 250/504 R, 250/493.1; 378/119; 372/5, 87
See application file for complete search history.

(56) References Cited

U.S. PATENT DOCUMENTS 2,759,106 A   8/1956   Wolter .......................... 250/53

(Continued)

OTHER PUBLICATIONS

Andreev, et al., "Enhancement of laser/EUV conversion by shaped laser pulse interacting with Li-containted targets for EUV lithography", Proc. Of SPIE, 5196:128-136, (2004).

(Continued)

*Primary Examiner*—Kiet T. Nguyen
(74) *Attorney, Agent, or Firm*—William Cray

(57) ABSTRACT

An EUV light source apparatus and method are disclosed, which may comprise a pulsed laser providing laser pulses at a selected pulse repetition rate focused at a desired target ignition site; a target formation system providing discrete targets at a selected interval coordinated with the laser pulse repetition rate; a target steering system intermediate the target formation system and the desired target ignition site; and a target tracking system providing information about the movement of target between the target formation system and the target steering system, enabling the target steering system to direct the target to the desired target ignition site. The target tracking system may provide information enabling the creation of a laser firing control signal, and may comprise a droplet detector comprising a collimated light source directed to intersect a point on a projected delivery path of the target, having a respective oppositely disposed light detector detecting the passage of the target through the respective point, or a detector comprising a linear array of a plurality of photo-sensitive elements aligned to a coordinate axis, the light from the light source intersecting a projected delivery path of the target, at least one of the which may comprise a plane-intercept detection device. The droplet detectors may comprise a plurality of droplet detectors each operating at a different light frequency, or a camera having a field of view and a two dimensional array of pixels imaging the field of view. The apparatus and method may comprise an electrostatic plasma containment apparatus providing an electric plasma confinement field at or near a target ignition site at the time of ignition, with the target tracking system providing a signal enabling control of the electrostatic plasma containment apparatus. The apparatus and method may comprise a vessel having and intermediate wall with a low pressure trap allowing passage of EUV light and maintaining a differential pressure across the low pressure trap. The apparatus and method may comprise a magnetic plasma confinement mechanism creating a magnetic field in the vicinity of the target ignition site to confine the plasma to the target ignition site, which may be pulsed and may be controlled using outputs from the target tracking system.

42 Claims, 12 Drawing Sheets

U.S. PATENT DOCUMENTS

| | | | |
|---|---|---|---|
| 3,150,483 A | 9/1964 | Mayfield et al. | 60/35.5 |
| 3,232,046 A | 2/1966 | Meyer | 50/35.5 |
| 3,279,176 A | 10/1966 | Boden | 60/202 |
| 3,746,870 A | 7/1973 | Demarest | 250/227 |
| 3,960,473 A | 6/1976 | Harris | 425/467 |
| 3,961,197 A | 6/1976 | Dawson | 250/493 |
| 3,969,628 A | 7/1976 | Roberts et al. | 250/402 |
| 4,042,848 A | 8/1977 | Lee | 313/231.6 |
| 4,088,966 A | 5/1978 | Samis | 313/231.5 |
| 4,143,275 A | 3/1979 | Mallozzi et al. | 250/503 |
| 4,162,160 A | 7/1979 | Witter | 75/246 |
| 4,203,393 A | 5/1980 | Giardini | 123/30 |
| 4,504,964 A | 3/1985 | Cartz et al. | 378/119 |
| 4,536,884 A | 8/1985 | Weiss et al. | 378/119 |
| 4,538,291 A | 8/1985 | Iwamatsu | 378/119 |
| 4,596,030 A | 6/1986 | Herziger et al. | 378/119 |
| 4,618,971 A | 10/1986 | Weiss et al. | 378/34 |
| 4,626,193 A | 12/1986 | Gann | 431/71 |
| 4,633,492 A | 12/1986 | Weiss et al. | 378/119 |
| 4,635,282 A | 1/1987 | Okada et al. | 378/34 |
| 4,751,723 A | 6/1988 | Gupta et al. | 378/119 |
| 4,752,946 A | 6/1988 | Gupta et al. | 378/119 |
| 4,837,794 A | 6/1989 | Riordan et al. | 378/119 |
| 5,023,897 A | 6/1991 | Neff et al. | 378/122 |
| 5,027,076 A | 6/1991 | Horsley et al. | 324/674 |
| 5,102,776 A | 4/1992 | Hammer et al. | 430/311 |
| 5,126,638 A | 6/1992 | Dethlefsen | 315/326 |
| 5,142,166 A | 8/1992 | Birx | 307/419 |
| 5,313,481 A | 5/1994 | Cook et al. | 372/37 |
| 5,411,224 A | 5/1995 | Dearman et al. | 244/53 |
| 5,448,580 A | 9/1995 | Birx et al. | 372/38 |
| 5,504,795 A | 4/1996 | McGeoch | 378/119 |
| 5,729,562 A | 3/1998 | Birx et al. | 372/38 |
| 5,763,930 A | 6/1998 | Partlo | 250/504 |
| 5,866,871 A | 2/1999 | Birx | 219/121 |
| 5,936,988 A | 8/1999 | Partlo et al. | 372/38 |
| 5,963,616 A | 10/1999 | Silfvast et al. | 378/122 |
| 6,031,241 A | 2/2000 | Silfvast et al. | 250/504 |
| 6,039,850 A | 3/2000 | Schulz | 204/192.15 |
| 6,051,841 A | 4/2000 | Partlo | 250/504 |
| 6,064,072 A | 5/2000 | Partlo et al. | 250/504 |
| 6,172,324 B1 | 1/2001 | Birx | 219/121.57 |
| 6,195,272 B1 | 2/2001 | Pascente | 363/21 |
| 6,452,199 B1 | 9/2002 | Partlo et al. | 250/504 |
| 6,566,667 B1 | 5/2003 | Partlo et al. | 250/504 |
| 6,566,668 B1 | 5/2003 | Rauch et al. | 250/504 |
| 6,576,912 B1 | 6/2003 | Visser et al. | 250/492.2 |
| 6,586,757 B1 | 7/2003 | Melnychuk et al. | 250/504 |
| 6,946,669 B1* | 9/2005 | Kleinschmidt | 250/504 R |
| 2001/0055364 A1 | 12/2001 | Kandaka et al. | 378/119 |
| 2002/0100882 A1 | 8/2002 | Partlo et al. | 250/504 |
| 2002/0163313 A1 | 11/2002 | Ness et al. | 315/111.01 |
| 2002/0168049 A1 | 11/2002 | Schriever et al. | 378/119 |
| 2003/0006383 A1 | 1/2003 | Melynchuk et al. | 250/504 |
| 2003/0068012 A1 | 4/2003 | Ahmad et al. | 378/119 |
| 2003/0219056 A1 | 11/2003 | Yager et al. | 372/57 |

OTHER PUBLICATIONS

Apruzese, J.P., "X-Ray Laser Research Using Z Pinches," *Am. Inst. of Phys.* 399-403, (1994).

Bollanti, et al., "Compact Three Electrodes Excimer Laser IANUS for a POPA Optical System," *SPIE Proc.* (2206)144-153, (1994).

Bollanti, et al., "Ianus, the three-electrode excimer laser," *App. Phys. B (Lasers & Optics)* 66(4):401-406, (1998).

Choi, et al., "A $10^{13}$ A/s High Energy Density Micro Discharge Radiation Source," *B. Radiation Characteristics*, p. 287-290.

Choi, et al., "Fast pulsed hollow cathode capillary discharge device," *Rev. of Sci. Instrum.* 69(9):3118-3122 (1998).

Fomenkov, et al., "Characterization of a 13.5nm Source for EUV Lithography based on a Dense Plasma Focus and Lithium Emission." Sematech Intl. Workshop on EUV Lithography (Oct. 1999).

Hansson, et al., "Xenon liquid jet laser-plasma source for EUV lithography," Emerging Lithographic Technologies IV, *Proc. Of SPIE*, vol. 3997:729-732 (2000).

Kato, Yasuo, "Electrode Lifetimes in a Plasma Focus Soft X-Ray Source," *J. Appl. Phys.* (33) Pt. 1, No. 8:4742-4744 (1991).

Kato, et al., "Plasma focus x-ray source for lithography," *Am. Vac. Sci. Tech. B.*, 6(1): 195-198 (1988).

Lebert, et al., "Soft x-ray emission of laser-produced plasmas using a low-debris cryogenic nitrogen target," *J. App. Phys.*, 84(6):3419-3421 (1998).

Lebert, et al., "A gas discharge based radiation source for EUV-lithography," Intl. Conf. Micro and Nano-Engineering 98 (Sep. 22-24, 1998) Leuven, Belgium.

Lebert, et al., "Investigation of pinch plasmas with plasma parameters promising ASE," Inst. Phys. Conf. Ser No. 125: Section 9, pp. 411-415 (1992) Schiersee, Germany.

Lebert, et al., "Comparison of laser produced and gas discharge based EUV sources for different applications," Intl. Conf. Micro- and Nano-Engineering 98 (Sep. 22-24, 1998) Leuven, Belgium.

Lee, Ja H., "Production of dense plasmas in hypocyloidal pinch apparatus," *The Phys. Of Fluids*, 20(2):313-321 (1977).

Lewis, Ciaran L.S., "Status of Collision-Pumped X-ray Lasers," *Am Inst. Phys.* pp. 9-16 (1994).

Malmqvist, et al., "Liquid-jet target for laser-plasma soft x-ray generation," *Am. Inst. Phys.* 67(12):4150-4153 1996).

Mather, et al., "Stability of the Dense Plasma Focus," *Phys. Of Fluids*, 12(11):2343-2347 (1969).

Mayo, et al., "A magnetized coaxial source facility for the generation of energetic plasma flows," *Sci. Technol.* vol. 4:pp. 47-55 (1994).

Mayo, et al., "Initial Results on high enthalpy plasma generation in a magnetized coaxial source," *Fusion Tech* vol. 26:1221-1225 (1994).

Nilsen, et al., "Analysis of resonantly photopumped Na-Ne x-ray-laser scheme," *Am Phys. Soc.* 44(7):4591-4597 (1991).

Orme, et al., "Electrostatic charging and deflection of nonconventional droplet streams formed from capillary stream breakup," *Physics of Fluids*, 12(9):2224-2235, (Sep. 2000).

Orme, et al., "Charged Molten Metal Droplet Deposition As a Direct Write Technology", MRS 2000 Spring Meeting, San Francisco, (Apr. 2000).

Pant, et al., "Behavior of expanding laser produced plasma in a magnetic field," *Physica Sripta*, T75:104-111, (1998).

Partlo, et al., "EUV (13.5nm) Light Generation Using a Dense Plasma Focus Device," *SPIE Proc. On Emerging Lithographic Technologies III.* vol. 3676, 846-858 (Mar. 1999).

Porter, et al., "Demonstration of Population Inversion by Resonant Photopumping in a Neon Gas Cell Irradiated by a Sodium Z Pinch." *Phys. Rev. Let.*, 68(6):796-799, (Feb. 1992).

Price, Robert H., "X-Ray Microscopy using Grazing Incidence Reflection Optics," *Am. Inst. Phys.*, pp. 189-199, (1981).

Qi, et al., "Fluorescence in Mg IX emission at 48.340 Å from Mg pinch plasmas photopumped by Al XI line radiation at 48.338 Å," *The Am. Phys. Soc.*, 47(3):2253-2263 (Mar. 1993).

Scheuer, et al., "A Magnetically-Nozzled, Quasi-Steady, Multimegawatt, Coaxial Plasma Thruster," *IEEE: Transactions on Plasma Science*, 22(6) (Dec. 1994).

Schriever, et al., "Laser-produced lithium plasma as a narrow-band extended ultraviolet radiation source for photoelectron spectroscopy," *App. Optics*. 37(7):1243-1248. (Mar. 1998).

Schriever, et al., "Narrowband laser produced extreme ultraviolet sources adapted to silicon/molybdenum multilayer optics," *L of App. Phys.* 83(9):4566-4571 (May 1998).

Silfvast, et al., "High-Power plasma discharge source at 13.5 nm and 11.4 nm for EUV lithography," *SPIE*, vol. 3676:272-275. (Mar. 1999).

Silfvast, et al., "Lithium hydride capillary discharge creates x-ray plasma at 13.5 namometers," *Laser Focus World* p. 13 (Mar. 1997).

Tillmack, et al., "Magnetic Confinement of an Expanding Laser-Produced Plasma", UC San Diego, Center for Energy Research, UCSD Report & Abramova—Tornado Trap.

Wilhein; et al., "A slit grating spectrograph for quantitative soft x-ray spectroscopy," Am. Inst. Of Phys. Rev. of Sci. Instrum., 70(3):1694-1699, (Mar. 1999).

Wu, et al., "The vacuum Spark and Spherical Pinch X-ray/ EUV Point Soruces," *SPIE, Conf. On Emerging Tech. III*, Santa Clara, CA, vol. 3676:410-420, (Mar. 1999).

Zombeck, M.V., "Astrophysical Observations with High Resolution X-ray Telescope," *Am. Inst. Of Phys.*, pp. 200-209, (1981).

\* cited by examiner

PLASMA CONFINED BY (NEARLY) RADIAL ELECTRIC FIELD

HIGH REPETITION RATE LASER PRODUCED PLASMA EUV LIGHT SOURCE

FIELD OF THE INVENTION

The present invention relates to a system for the generation of EUV light using a laser produced plasma and discrete targets in the form of solid particles or droplets or solid particles imbedded in a droplet delivered to an irradiating site for irradiation by a pulsed laser beam.

RELATED APPLICATIONS

The present application is related to a application Ser. No. 10/798,740, COLLECTOR FOR EUV LIGHT SOURCE, filed on Mar. 10, 2004, the disclosure of which is hereby incorporated by reference.

BACKGROUND OF THE INVENTION

LPP EUV sources have been under discussion for some time. As the requirements for, e.g., smaller and smaller integrated circuit critical dimension lithography and the concomitant requirement for shorter and shorter wavelength light sources, in the ranges of tens of tens of nanometers (e.g., 10–30), the need for a workable EUV light source that can also meet all of the requirements for power, repetition rate, dose stability, and the like requirements the actual requirements for an EUV light source, e.g., for use as a lithography light source, are becoming more clear. By way of example, there are some indications of what the power requirements could be. One way to look at this is to compare reported performance of a laser produced plasma ("LPP") system, e.g. the TRW/CEO, system, incorporating certain lithography parameters that appear to be system requirements, with proposals for a deep plasma focus system, a variety of discharge produced plasma "(DPP") systems. Reported numbers for the TRW/CEO system are shown below in Table I.

TABLE I

| | TRW/CEO LPP |
|---|---|
| Collected EUV power at intermediate focus ("I.F.") | 100 W** |
| Collector optical transmission | 55%* |
| EUV power into collector | 181 W |
| Geometric collection efficiency | 5 str/2π str |
| EUV power into 2π str | 227 W |
| Laser-to-EUV conversion | 1.0% |
| "Pump" power into vessel | 22,700 W |
| Electrical-to-laser conversion | 3% |
| Wall plug electrical power | 756,666 W |

*According to a TRW/CEO poster paper given at the 2003 SPIE.
**According to requirements being stated by potential customers for EUV light sources.

While some systems in use, e.g., in an integrated circuit fabrication facility require power in the range of a kilowatt, the likelihood is that there would be required many more scanners using EUV light sources per fab than, e.g., ion implanters or rapid thermal annealing systems, also requiring this type of projected input power. There is a clear need for improvements to proposals for EUV light source efficiencies.

One area of critical importance to the overall efficiency of such an EUV light source is the collector. Many issues of collector efficiency need to be addressed, including debris management, which can interfere with the ability to deliver the required light energy to the intermediate focus and also decrease economic efficiency of the light source if debris, e.g., requires frequent replacement of the collector due to inability to control debris deposition over time. Proposals for a collector system have been discussed in the application Ser. No. 10/798,780 entitled COLLECTOR FOR EUV LIGHT SOURCE, filed on Mar. 10, 2004, the disclosure of which is hereby incorporated by reference.

With, e.g., a 10% electrical-to-laser conversion efficiency then the required wall plug power becomes 227,000 W. This value is essentially the same as for the discharge produced plasma ("DPP"). If TRW/CEO can also achieve their stated goal of doubling the laser-to-EUV efficiency, then the required wall plug power becomes 113,500 W. Of course, the methods of increasing this conversion efficiency will likely apply to the DPP and thus the DPP wall plug requirements will also drop by half.

One of the driving forces behind the design of an EUV lithography light source and, e.g., the selection of target material, collector strategy, discharge produced plasma ("DPP", e.g., deep plasma focus ("DPF") or laser produced plasma ("LPP") and the like is the requirement by the lithography tool manufacturers regarding the level of out-of-band radiation, e.g., produced by an LPP source, e.g., with a 248 nm drive laser. Since the EUV multi-layer mirrors exhibit high reflectivity to the UV region and many of the proposed EUV photoresists are sensitive to UV/DUV, it is critical that the source does not produce a large amount of radiation, e.g., in the 130–400 nm range. With a 248 nm drive laser, as opposed to an infrared drive laser, even a small amount of scattered laser light may lead to high levels of UV radiation from the EUV source.

The currently contemplated full specification for out-of-band radiation for a production EUV source is listed below in the wavelength ranges of interest and the allowed ratio to the in-band, e.g., at 13.5 nm energy.

| Range | Allowed Percentage (relative to 13.5 nm in-band) |
|---|---|
| 10–40 nm | 100% |
| 40–130 nm | 100% |
| 130–400 nm | 1% |
| 400–800 nm | 100% |
| >800 nm | 0.05% |

Therefore all radiation, e.g., between 130 nm and 400 nm must be less than 1% of the in-band 13.5 nm radiation. Thus, if one assumes, e.g., a 2% contribution into in-band EUV then one must also have only a 0.02% conversion efficiency into the 130–400 nm band. This is an incredibly tight requirement, for both LPPs and DPPs.

Behavior of expanding laser produced plasma and/or the effects of magnetic fields on plasmas have been modeled and studied, as discussed, e.g., in H. Pant, "Behavior of Expanding Laser Produced Plasma in a Magnetic Field," Physica Scripta, Vol. T75 (1998), pp. 104–111; Tillmack, Magnetic Confinement of LPP, UCSD Report and Abramova, "Tornado Trap", the disclosures of which are hereby incorporated by reference.

SUMMARY OF THE INVENTION

An EUV light source apparatus and method are disclosed, which may comprise a pulsed laser providing laser pulses at a selected pulse repetition rate focused at a desired target ignition site; a target formation system providing discrete targets at a selected interval coordinated with the laser pulse repetition rate; a target steering system intermediate the target formation system and the desired target ignition site; and a target tracking system providing information about the movement of target between the target formation system and the target steering system, enabling the target steering system to direct the target to the desired target ignition site. The target tracking system may provide information enabling the creation of a laser firing control signal, and may comprise a droplet detector comprising a collimated light source directed to intersect a point on a projected delivery path of the target, having a respective oppositely disposed light detector detecting the passage of the target through the respective point, or a detector comprising a linear array of a plurality of photo-sensitive elements aligned to a coordinate axis, the light from the light source intersecting a projected delivery path of the target, at least one of the which may comprise a plane-intercept detection device. The droplet detectors may comprise a plurality of droplet detectors each operating at a different light frequency, or a camera having a field of view and a two dimensional array of pixels imaging the field of view. The apparatus and method may comprise an electrostatic plasma containment apparatus providing an electric plasma confinement field at or near a target ignition site at the time of ignition, with the target tracking system providing a signal enabling control of the electrostatic plasma containment apparatus. The apparatus and method may comprise a vessel having and intermediate wall with a low pressure trap allowing passage of EUV light and maintaining a differential pressure across the low pressure trap. The apparatus and method may comprise a magnetic plasma confinement mechanism creating a magnetic field in the vicinity of the target ignition site to confine the plasma to the target ignition site, which may be pulsed and may be controlled using outputs from the target tracking system.

DETAILED DESCRIPTION OF PREFERRED EMBODIMENTS

Figure 1:
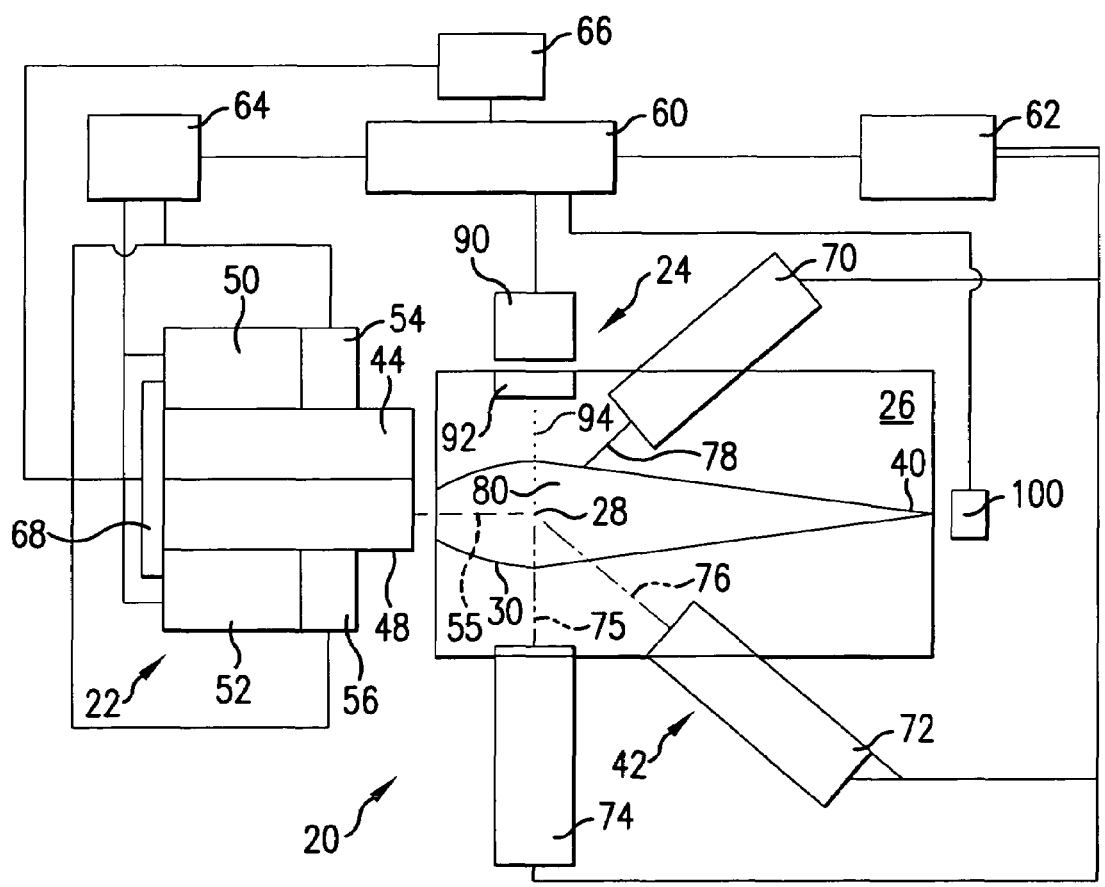
FIG. 1 shows a schematic view of an overall broad conception for a laser-produced plasma EUV light source according to an aspect of the present invention.

Turning now to FIG. 1 there is shown a schematic view of an overall broad conception for an EUV light source, e.g., a laser produced plasma EUV light source 20 according to an aspect of the present invention. The light source 20 may contain a pulsed laser system 22, e.g., a gas discharge excimer or molecular fluorine laser operating at high power and high pulse repetition rate and may be a MOPA configured laser system, e.g., as shown in U.S. Pat. Nos. 6,625, 191, 6,549,551, and 6,567,450. The light source 20 may also include a target delivery system 24, e.g., delivering targets in the form of liquid droplets, solid particles or solid particles contained within liquid droplets. The targets may be delivered by the target delivery system 24, e.g., into the interior of a chamber 26 to an irradiation site 28, otherwise known as an ignition site or the sight of the fire ball. Embodiments of the target delivery system 24 are described in more detail below.

Laser pulses delivered from the pulsed laser system 22 along a laser optical axis 55 through a window (not shown) in the chamber 26 to the irradiation site, suitably focused, as discussed in more detail below in coordination with the arrival of a target produced by the target delivery system 24 to create an ignition or fire ball that forms an x-ray releasing plasma, having certain characteristics, including wavelength of the x-ray light produced, type and amount of debris released from the plasma during or after ignition, according to the material of the target.

The light source may also include a collector 30. e.g., a reflector, e.g., in the form of a truncated ellipse, with an aperture for the laser light to enter to the ignition site 28. Embodiments of the collector system are described in more detail below. The collector 30 may be, e.g., an elliptical mirror that has a first focus at the ignition site 28 and a second focus at the so-called intermediate point 40 (also called the intermediate focus 40) where the EUV light is output from the light source and input to, e.g., an integrated circuit lithography tool (not shown). The system 20 may also include a target position detection system 42. The pulsed system 22 may include, e.g., a master oscillator-power amplifier ("MOPA") configured dual chambered gas discharge laser system having, e.g., an oscillator laser system 44 and an amplifier laser system 48, with, e.g., a magnetic reactor-switched pulse compression and timing circuit 50 for the oscillator laser system 44 and a magnetic reactor-switched pulse compression and timing circuit 52 for the amplifier laser system 48, along with a pulse power timing monitoring system 54 for the oscillator laser system 44 and a pulse power timing monitoring system 56 for the amplifier laser system 48. The system 20 may also include an EUV light source controller system 60, which may also include, e.g., a target position detection feedback system 62 and a firing control system 65, along with, e.g., a laser beam positioning system 66.

The target position detection system may include a plurality of droplet imagers 70, 72 and 74 that provide input relative to the position of a target droplet, e.g., relative to the ignition site and provide these inputs to the target position detection feedback system, which can, e.g., compute a target position and trajectory, from which a target error can be computed, if not on a droplet by droplet basis then on average, which is then provide as an input to the system controller 60, which can, e.g., provide a laser position and direction correction signal, e.g., to the laser beam positioning system 66 that the laser beam positioning system can use, e.g., to control the position and direction of the laser position and direction changer 68, e.g., to change the focus point of the laser beam to a different ignition point 28.

The imager 72 may, e.g., be aimed along an imaging line 75, e.g., aligned with a desired trajectory path of a target droplet 94 from the target delivery mechanism 92 to the desired ignition site 28 and the imagers 74 and 76 may, e.g., be aimed along intersecting imaging lines 76 and 78 that intersect, e.g., alone the desired trajectory path at some point 80 along the path before the desired ignition site 28.

The target delivery control system 90, in response to a signal from the system controller 60 may, e.g., modify the release point of the target droplets 94 as released by the target delivery mechanism 92 to correct for errors in the target droplets arriving at the desired ignition site 28.

An EUV light source detector 100 at or near the intermediate focus 40 may also provide feedback to the system controller 60 that can be, e.g., indicative of the errors in such things as the timing and focus of the laser pulses to properly intercept the target droplets in the right place and time for effective and efficient LPP EUV light production.

Figure 1A:
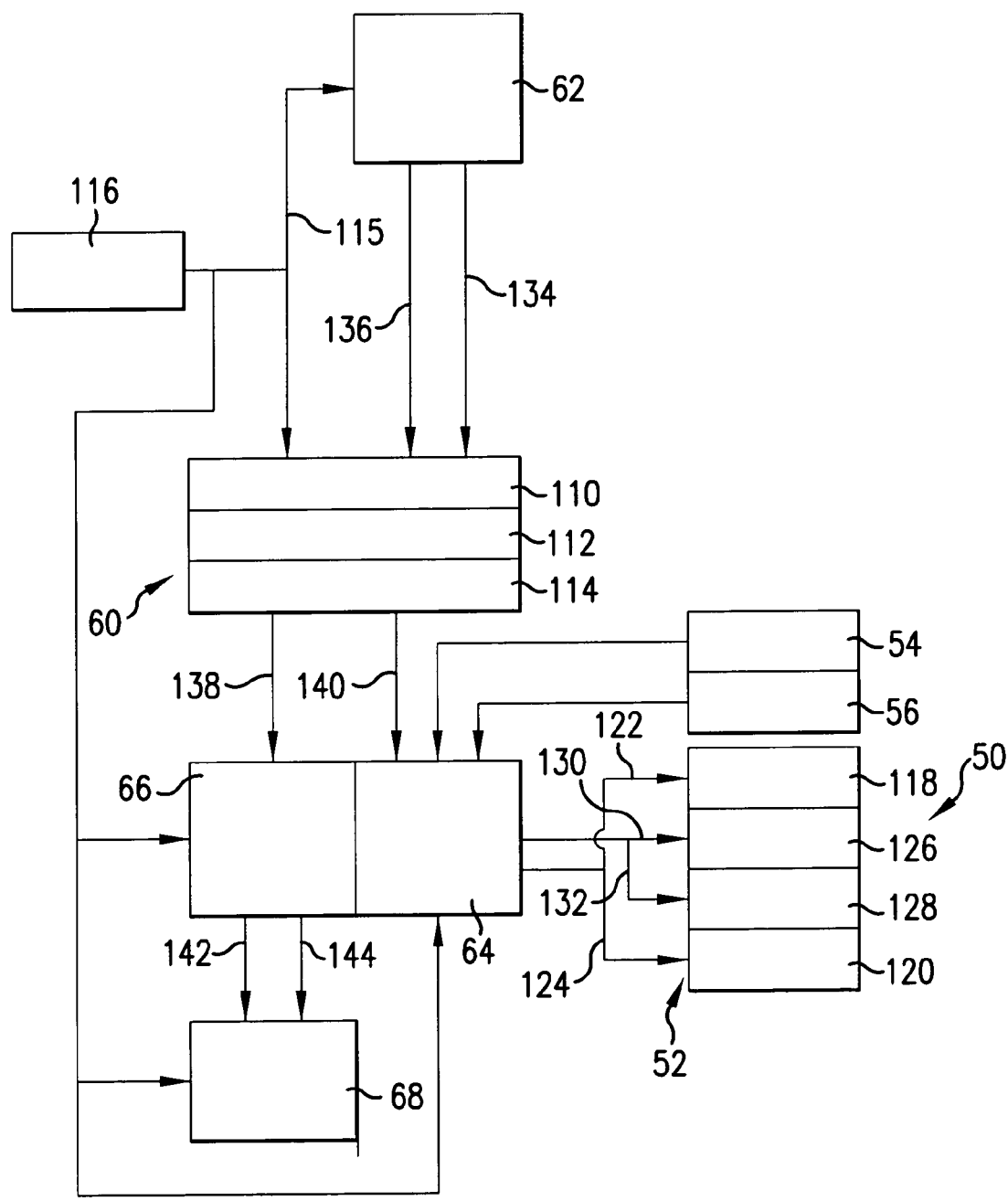
FIG. 1A shows schematically the operation of the system controller according to an aspect of an embodiment of the present invention.

Turning now to FIG. 1A there is shown schematically further details of a controller system 60 and the associated monitoring and control systems, 62, 64 and 66 as shown in FIG. 1. The controller may receive, e.g., a plurality of position signal 134, 136 a trajectory signal 136 from the target position detection feedback system, e.g., correlated to a system clock signal provided by a system clock 116 to the system components over a clock bus 115. The controller 60 may have a pre-arrival tracking and timing system 110 which can, e.g., compute the actual position of the target at some point in system time and a target trajectory computation system 112, which can, e.g., compute the actual trajectory of a target drop at some system time, and an irradiation site temporal and spatial error computation system 114, that can, e.g., compute a temporal and a spatial error signal compared to some desired point in space and time for ignition to occur.

The controller 60 may then, e.g., provide the temporal error signal 140 to the firing control system 64 and the spatial error signal 138 to the laser beam positioning system 66. The firing control system may compute and provide to a resonance charger portion 118 of the oscillator laser 44 magnetic reactor-switched pulse compression and timing circuit 50 a resonant charger initiation signal 122 and may provide, e.g., to a resonance charger portion 120 of the PA magnetic reactor-switched pulse compression and timing circuit 52 a resonant charger initiation signal, which may both be the same signal, and may provide to a compression circuit portion 126 of the oscillator laser 44 magnetic reactor-switched pulse compression and timing circuit 50 a trigger signal 130 and to a compression circuit portion 128 of the amplifier laser system 48 magnetic reactor-switched pulse compression and timing circuit 52 a trigger signal 132, which may not be the same signal and may be computed in part from the temporal error signal 140 and from inputs from the light out detection apparatus 54 and 56, respectively for the oscillator laser system and the amplifier laser system.

The spatial error signal may be provided to the laser beam position and direction control system 66, which may provide, e.g., a firing point signal and a line of sight signal to the laser bean positioner which may, e.g. position the laser to change the focus point for the ignition site 28 by changing either or both of the position of the output of the laser system amplifier laser 48 at time of fire and the aiming direction of the laser output beam.

Figure 2A:
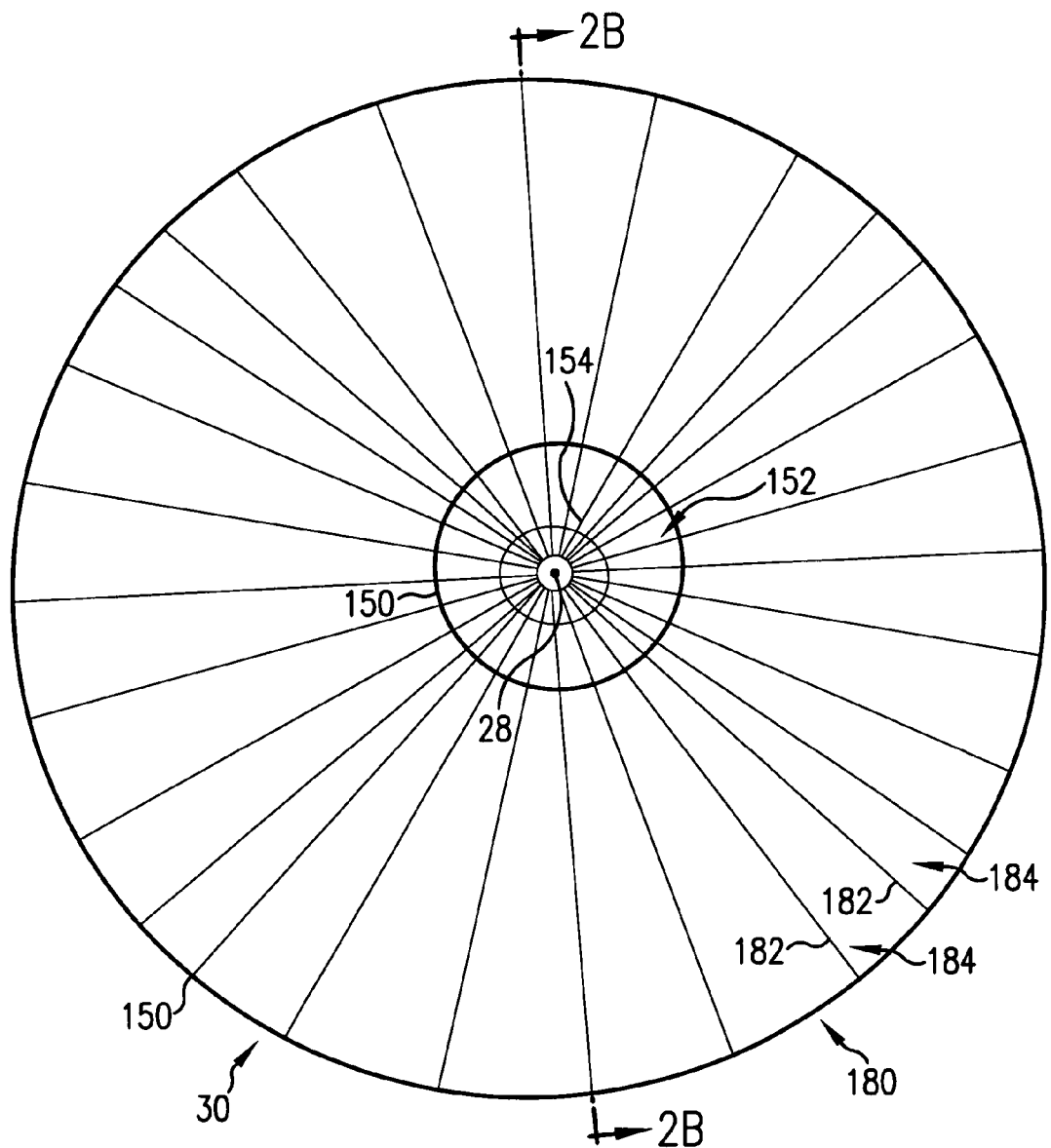
FIG. 2A shows a side view of an embodiment of an EUV light collector according to an aspect of the present invention looking from an irradiation ignition point toward an embodiment of a collector according to an embodiment of the present invention.
Figure 2B:
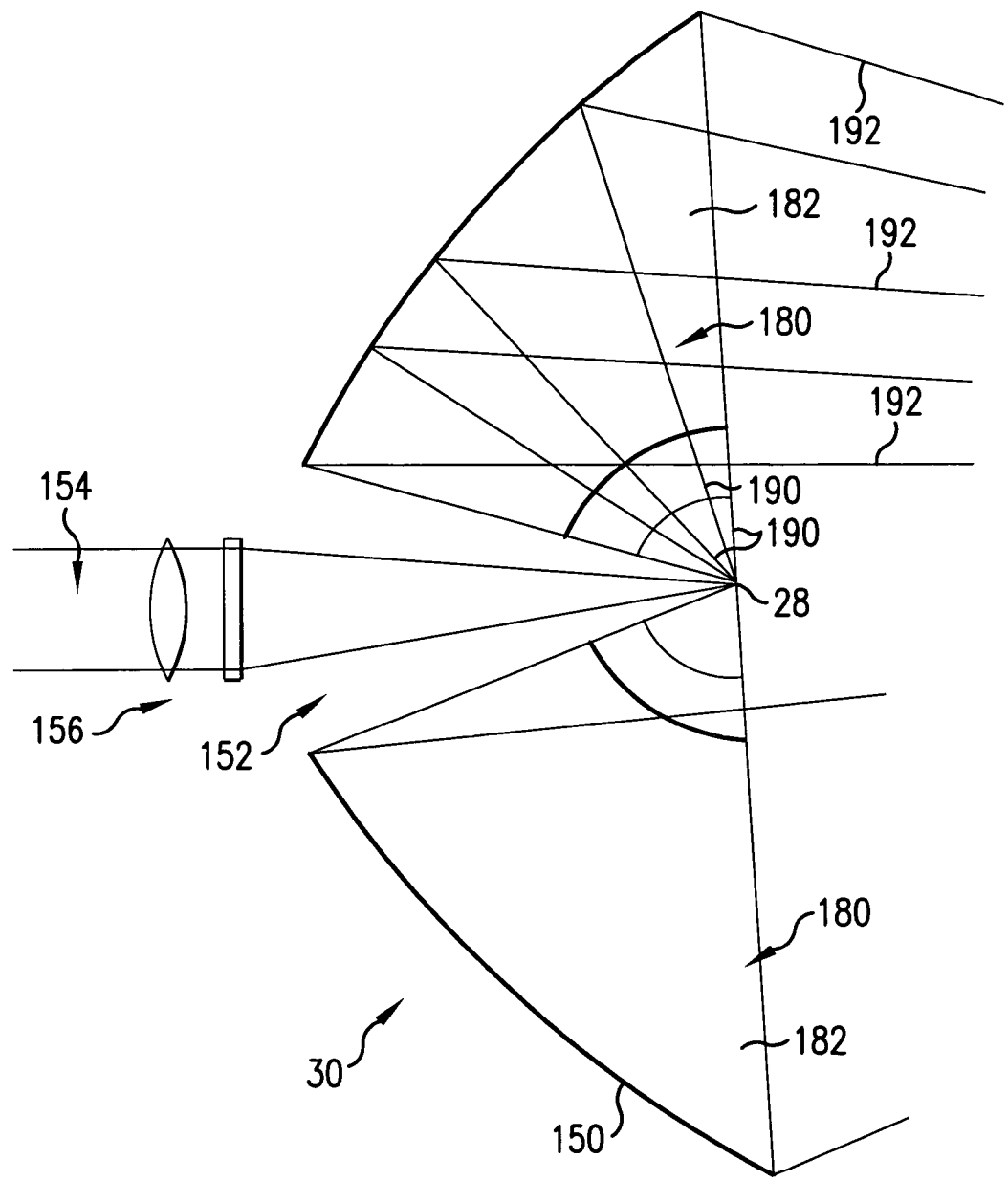
FIG. 2B shows a cross-sectional view of the embodiment of FIG. 2A along the lines 2B in FIG. 2A.

Turning now to FIGS. 2A and 2B there is shown, respectively a schematic view side view of a collector 30 looking into the collector mirror 150, and a cross-sectional view of the rotationally symmetric collector mirror 150 arrangement along cross-sectional lines 2B in FIG. 2A (although the cross-sectional view would be the same along any radial axis in FIG. 2A.

As shown in FIG. 2A the elliptical collection mirror 150 is circular in cross section looking at the mirror, which may be the cross-section at the greatest extension of the mirror, which is shown in FIG. 1A to be almost to the focus point 28 of the elliptical mirror 150, so as not to block target droplets 94 from reaching the ignition point designed to be at the focus point 28. It will be understood, however, that the mirror may extend further towards the intermediate focus, with a suitable hole in the mirror (not shown) to allow passage of the target droplets to the focus point. The elliptical mirror may also have an aperture 152, e.g., shown to be circular in FIG. 2A, to allow entry of the LPP laser beam 154, e.g., focused through focusing optics 156, through the mirror 150 to the ignition point 28 desired to be at the focus of the elliptical mirror. The aperture 152 can also be, e.g., more tailored to the beam profile, e.g., generally rectangular, within the requirements, if any of modifying the beam optical path to make corrections of the focus of the laser beam 154 on an ignition site, depending upon the type of control system employed.

Also shown in FIGS. 2A and 2B is a debris shield 180 according to an aspect of an embodiment of the present invention. The debris shield 180 may be made up of a plurality of thin plates 182, made, e.g., of thin foils of, e.g., molybdenum, extending radially outward from the desired ignition site and defining narrow planar radially extending channels 184 through the debris shield 180. The illustration of FIG. 2A is very schematic and not to scale and in reality the channels are as thin as can possibly be made. Preferably the foil plates 182 can be made to be even thinner than the channels 184, to block as little of the x-ray light emitted from the plasma formed by ignition of a target droplet 94 by the laser beam 155 focused on the ignition site 28.

Seen in cross section in FIG. 2B, the functioning of the channels 182 in the debris shield 180 can be seen. A single radial channel is seen in FIG. 2B and the same would be seen in any section of the collector 30 through the rotationally symmetric axis of rotation of the collector mirror 150 and debris shield 180 within a channel of the debris shield 180. Each ray 190 of EUV light (and other light energy) emitted from the ignition site 28 traveling radially outward from the ignition site 28 will pass through a respective channel 182 in the debris shield 180, which as shown in FIG. 2B may, if desired, extend all the way to the collection mirror 150 reflective surface. Upon striking the surface of the elliptical mirror 150, at any angle of incidence, the ray 190 will be reflected back within the same channel 180 as a reflected ray 192 focused on the intermediate focus 40 shown in FIG. 1.

Figure 3:
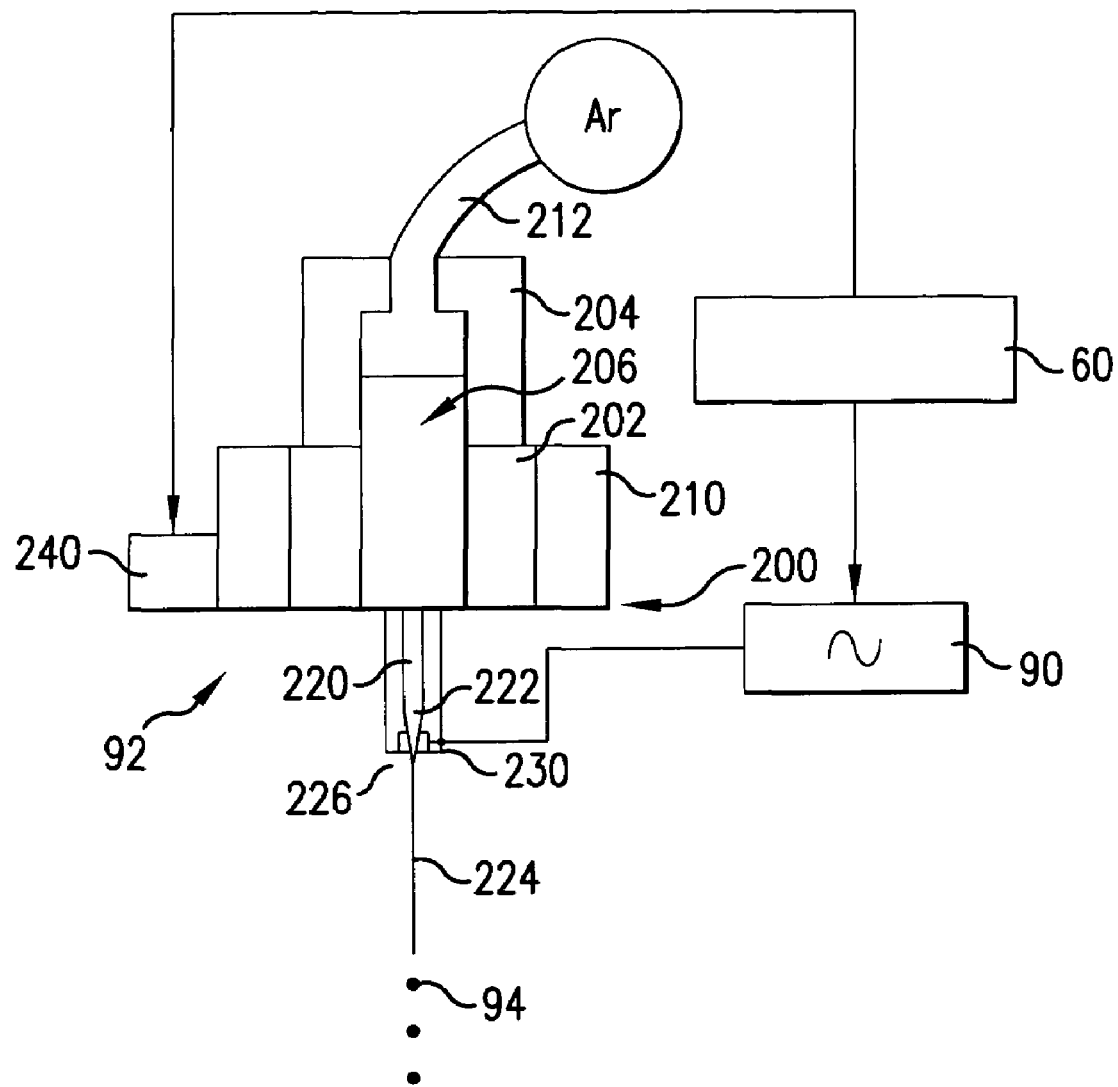
FIG. 3 shows in schematic form a possible embodiment of a target delivery system according to an aspect of an embodiment of the present invention.

Turning now to FIG. 3 there is shown a possible embodiment of a target formation/delivery system 24 according to an aspect of an embodiment of the present invention. The target deliver system 24 may comprise, e.g., a target formation/delivery apparatus 200, which may have, e.g., a body 202 and a cap 204, with the body 202 and the cap 204, e.g., defining an interior cavity 206 which may contain target material, e.g., lithium, e.g., in a relatively pure state and, e.g., in a liquid form or even a solid form, e.g., relatively uniform radius pellets of, e.g., about 20 µm in diameter. As illustrated in FIG. 3, the source is lithium in liquid form which may be fed to the cavity 206, e.g., in liquid or solid form through a source input (not shown) and may, e.g., be kept under pressure of, e.g., 10–20 psi, for, e.g., for liquid tin as a target, and likely much less for lithium, based on the difference in mass and viscosity between tin and lithium, through a source 212 for, e.g., pressurizing gas, which may be, e.g., argon.

The target formation/delivery apparatus 200 may also have heaters, e.g., cartridge heaters 210, e.g., annularly surrounding the body 202 and serving to, e.g., heat the body to, e.g., maintain the liquid target material, e.g., liquid lithium in liquid form, e.g., by maintaining the material in the cavity at or above, e.g., 500° C. for lithium.

The cavity 206 at, e.g., its lower end may open into a nozzle 220, which may have a narrowing portion 222, which may serve, e.g., in the alternative embodiment of a solid target pellet source to narrow down to essentially the size of one target pellet before a nozzle opening 226 at the terminal end of the nozzle 220, and in the case of the embodiment using liquid target material, narrowing down to a size that essentially defines a stream 220 of about, e.g., 20 µm in diameter, which can serve, e.g., to separate into target droplets 94.

Target droplets 94 may be formed, e.g., through the use of a perturber 226, which may, e.g., under the influence of a signal from a target delivery system controller 90, e.g., a periodic signal, e.g., a sign wave as indicated schematically in FIG. 3, squeeze the nozzle to add perturbing discontinuities into the liquid stream 224, which can, e.g., select the size and distribution of the target drops 94 that actually form eventually from the stream 224. The target delivery controller may, in turn be controlled from the overall system controller 60.

The overall system controller 60 may also control a target delivery system position controller 240, e.g., based on information supplied to the overall system controller 60 regarding position error of a previously delivered target droplet or droplets in regard to, e.g., a desired ignition site. The position controller 240 may translate the target formation/delivery apparatus, e.g., in a plane orthogonal to the axis of the output stream 224 to, e.g., adjust the location of the nozzle output 226 in that plane. This may be done by servo motors or piezoelectric actuators or a combination of both, e.g., for a slow aiming control loop and a faster speed aiming control loop or, e.g., course and fine aiming control.

Applicants have noted in experiments that that in delivering, e.g., a 20 µm diameter droplet to a desired target simulated ignition site over a distance of, e.g., about 50 µm (larger distances may also be needed for protection of, e.g., the nozzle from the plasma and its debris, an error of, e .g., about 0.25 mm can occur in the arrival point vis-à-vis the desired target ignition site. Applicants believe that this is due to the droplet initially leaving the nozzle of the target formation apparatus 200 at an angle to the correct trajectory path to the target site, normally true vertical (as shown illustratively in FIG. 3). Applicants also believe that this may be due to some effects such as lateral differences in temperature or the like across the nozzle opening, which may be relatively steady state once formed. To this effect, applicants propose that a tilting mechanism (not shown) e.g., incorporated in the target formation system 92 position controller 240, to tilt the nozzle equally and oppositely away from the droplet formation axis tilt error, based, e.g., on feedback of target position error signals measuring the effect of this droplet formation axis tilt error to remove the error in target arrival position, e.g., vis-à-vis the target ignition site. This may be done, e.g., with piezoelectric elements, which may only need to induce a tilt of, e.g., 5–10 steradians in the nozzle to counteract the droplet formation axis error at the nozzle output for a correct flight path to the target ignition site.

The overall system controller 60 may also provide a signal (not shown) to the target delivery system 92 to control the pressure of the, e.g., argon pressurizing gas which may, e.g., serve to adjust the size of the ultimate droplets 94, the delivery rate of the droplets 94, the spacing of the droplets 94, or some other operating parameter of the formation/delivery of the droplets 94 to the desired ignition site 28 or to a target tracking and steering system 350, discussed in more detail below, for ultimate delivery to the ignition site 28.

Figure 4A:
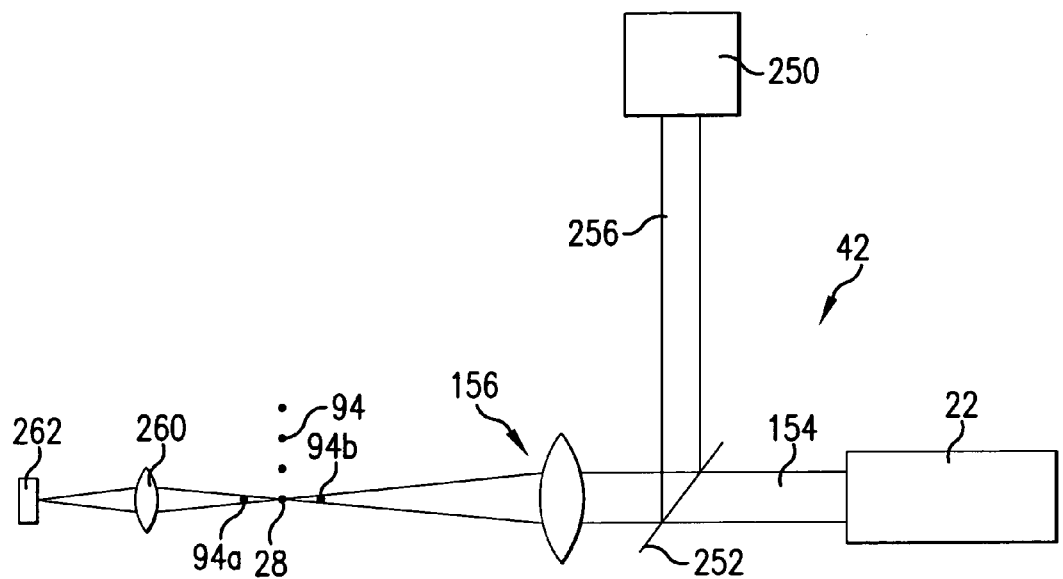
FIGS. 4A and B show schematically a possible embodiment of a target tracing system according to an aspect of an embodiment of the present invention, with FIG. 4A being a schematic side view of an aspect of the embodiment and FIG. 4B being a plan view of an aspect of the embodiment.

Turning now to FIGS. 4A and B there are shown aspects of an embodiment of a possible target tracking system 42 according to an aspect of an embodiment of the present invention. The target tracking system 42 may comprise, e.g., a helium-neon laser (HeNe) laser 250, selected, e.g., for its relatively inexpensive nature. The HeNe laser may produce a beam 256 of light at a wavelength/frequency of, e.g., 632–38 nm, and may be delivered to an optic 252 that is, e.g., also impinged by the laser light source 22 beam 154 and may be, e.g., essentially fully transmissive of the beam 154 and may, e.g., reflect part of the beam 256, e.g., through the same focusing optics 156 as for the beam 154, i.e., focused to the desired ignition spot 28.

The target tracking system 42 may also include, e.g., another focusing optic 260 that may, e.g., focus the light passing through the focus point at the ignition site 28 onto, e.g., a detector 262. The detector 262 may be, e.g., a photodiode or an array of photodiodes, e.g., a linear array of photodiodes, selected to be sensitive to light in the band of the HeNe laser and not in the band of the laser 22. The detector 262 may, e.g., provide an output signal, a high or a low, each time, e.g., the light from the HeNe laser 250, to which it is selectively sensitive, is cut off, e.g., to one or more photo-diodes of the detector, e.g., by the passage of a droplet 94 into the path of the light from the HeNe laser, e.g., at or near the ignition point 28.

It will be understood that the detector may comprise, e.g., a linear array of photo-diodes sensitive to the wavelength of the HeNe laser and provide to the controller 60 or to some feedback system, e.g., position feedback system 62, a signal or signals that can be analyzed to determine some displacement in the array, e.g., in the direction toward or away from the lateral array or across the array, e.g., in the lateral axis of the array, indicating, e.g., the passage of a target droplet through or on either side of the true ignition site 28 in, e.g., some plane, e.g., a horizontal plane (so oriented as shown in FIG. 4A, assuming that the horizontal plane is oriented orthogonal to the plane of the paper) through the ignition site 28.

It will also be understood that if the detector 262 includes another linear array of photo-diodes, e.g., oriented vertically (as shown in the figure) the some distribution of intensity signals from the array may be used, e.g., to determine a lateral displacement of the droplet from the ignition site, e.g., as shown illustratively at positions 94a and 94b in FIG. 4A.

Barring the ability to discern such an error displacement horizontally or vertically from varying intensities or displacement of an intensity signal to, e.g., other than a central photo-diode in such an array (horizontal or vertical), then displacement of the droplet, e.g., as shown in FIG. 4A to either the position 94a or 94b may simply give a false indication that the droplet 94 is on target, e.g., if enough of the HeNe light is blocked from the detector, even by an erroneously located droplet, e.g., as shown schematically and not to scale by positions 94a and 94b. Then the output signal of the photodiode(s) in the detector 262 may be still interpreted to be the low (or high) signal mentioned above indicating the target droplet 94 to be at the ignition site 28.

Figure 4B:
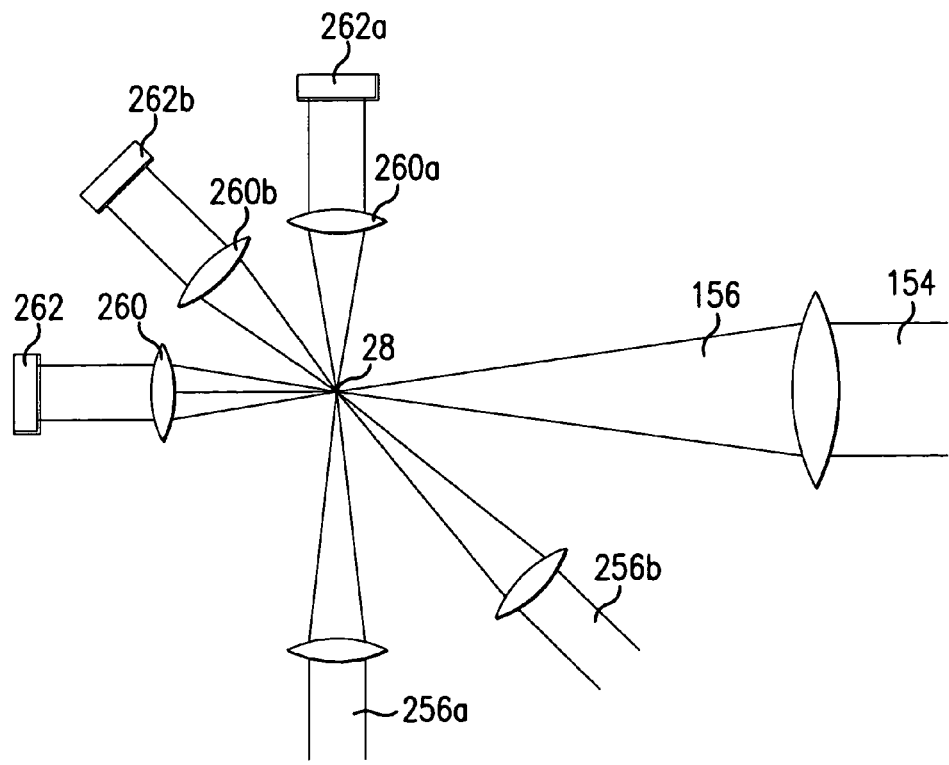

Referring to FIG. 4B, there is shown another possible arrangement according to aspects of an embodiment of the present invention that may serve to alleviate this possible error in the tracking system 42 operation, by, e.g., requiring a plurality of such intersected signals, e.g., two or three to indicate the droplet 94 has intersected the ignition site 28. The embodiment of FIG. 4B may again incorporate the beam 256 as shown in FIG. 4A passing through the irradiating laser beam 154 focusing optic 156, as explained in regard to FIG. 4A. One advantage of passing through this optic 156, is that the HeNe beam 256 is always focused to the desired ignition spot 28, assuming there is feedback, as discussed in more detail below that uses, e.g., the focusing optic 156, by either moving the optic 156 or, if possible and convenient, moving the laser 22, or using beam pointing equipment as discussed in more detail below, all to, e.g., focus to an ignition site 28, e.g., according to where the droplets 94 are being delivered by the target deliver system 92 as discussed above and/or target tracking and steering system 350 as discussed below.

The embodiment of FIG. 4B may also comprise, e.g., at least one additional target tracking laser system, e.g., delivering a laser bean, e.g., from a HeNe laser, e.g., 256a and 256b to another focusing optic, e.g., 260a and 260b, respectively focused on another detector, e.g., 262a and 262b, respectively. In this manner, two or more low (or high) signals must be received by the feedback system 62, to indicate that the droplet 94 has passed through the ignition site from, e.g., two additional angles of imaging the ignition site 28. As explained above, the respective detectors 262, 262a and 262b may have, e.g., a linear array or orthogonal linear arrays of photo-detectors that may provide intensity data in the photodiodes of such array(s) that can be used to determine position errors, horizontally or vertically or both of the droplet 94 in relation to the desired ignition site. This may even enable the intensity data to be used to detect position error of the droplet from an ignition site 28' (not shown) different from some fixed desired ignition site, e.g., if the laser 22 is focused to the new site 28' due to target delivery system error in delivering the target droplets to the fixed desired ignition site, i.e., perfectly on the focus of the collector.

It will be also understood that one of the HeNe laser beans 256, 256a or 256b may be oriented to be above the plane of the paper as illustrated in FIG. 4B such that it may detect the passage of a target droplet through a location (not shown) prior to reaching the ignition site 28. This may be used, e.g., by the feedback controller 62 and/or the main controller 60, to compute, e.g., a time of flight from the position in the droplet path above the ignition site 28 to the ignition site 28, as detected, e.g., by the other two of the three detectors 262, 262a and 262b.

Due to, e.g., limitations in the time of response, sensitivity of response or the like, of the detectors, e.g., 262, 262a and 262b, the above referenced tracking system may not be responsive enough or provide enough data or data that can be processed quickly enough for purposes of accomplishing some or all of the desired functionalities of the target tracking system 42 according to aspects of embodiments of the present invention, at least on a droplet by droplet basis.

One of the imaging devices and detector 256, 256a and 256b and 262, 262a and 262b may be formed with, e.g., an elongated cylindrical lens to form, e.g., a planar detection plane above the plane of the ignition site, e.g., as viewed in FIG. 4A, e.g., to detect the passage of the droplet target 94 through the plane. In such an event, a system illustrated schematically in FIG. 5 may be used to supplement or replace some or all aspects of the target tracking system described in relation to FIGS. 4A and B.

The laser beams 256, 256a and 256b may be generated by different lasers than a HeNe, or, e.g., they may be, e.g., frequency doubled and added to obtain, e.g., harmonics in order to be able at the detectors 262, 262a and 262b to discriminate between the detected image light, e.g., by using photo-diodes sensitive only to the specific frequency to, e.g., eliminate cross-illumination of the detectors 262, 262a and 262b.

Figure 5:
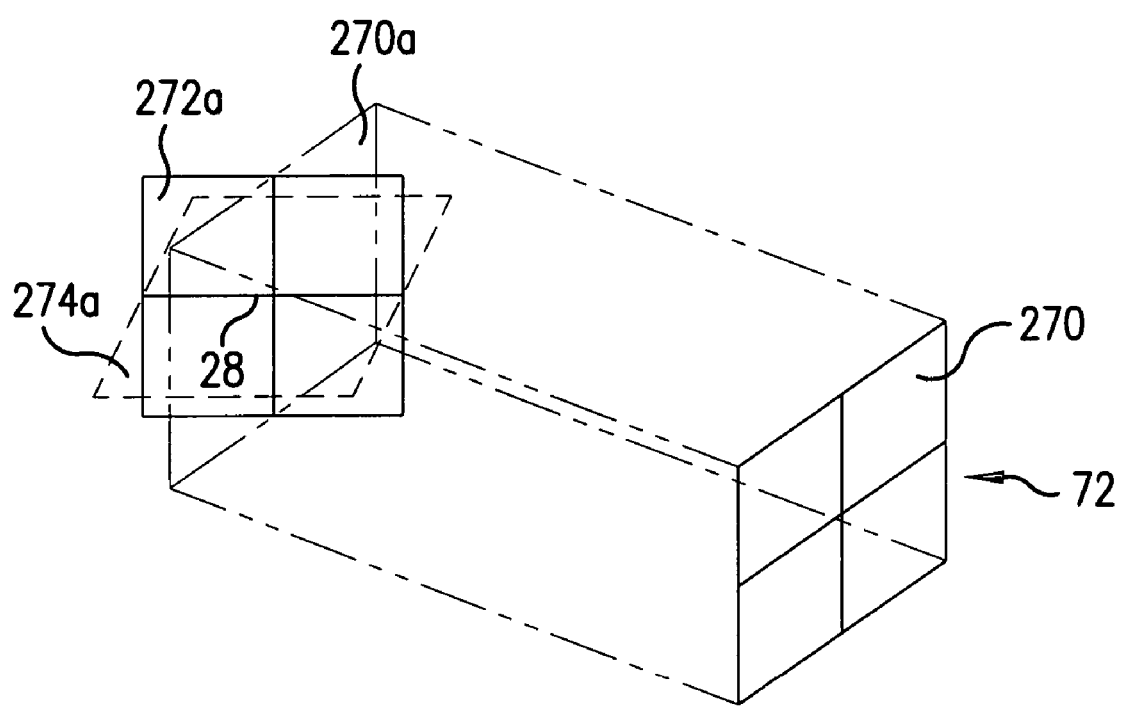
FIG. 5 shows a schematic perspective view of aspects of an alternative embodiment of a target tracking system according to an aspect of an embodiment of the present invention.

In FIG. 5 there is shown schematically a possible high resolution target tracking system 42. FIG. 5 illustrates schematically the intersection in the vicinity of the ignition site the fields of view 270a, 272a and 274a of, e.g., three imaging cameras, e.g., 70, 72 and 74 shown illustratively in FIG. 1, except for the modification that in FIG. 5 all of the camera fields of view intersect each other and may, e.g., all intersect at the ignition site 28. As in the example shown in FIG. 5, each of the fields of view may be mutually orthogonal to the others. FIG. 5 also illustrates one of the fields of view, e.g., 270 extending back to, e.g., a square array of detector pixels 270, e.g., in an imaging camera 72, which may, e.g., be a digital camera, e.g., employing a square array 270 of pixels, e.g., each formed by charge coupled devices or CMOS imaging integrated circuits or a single chip CCD or CMOS imager or the like as are well known in the digital camera art.

Figure 9:
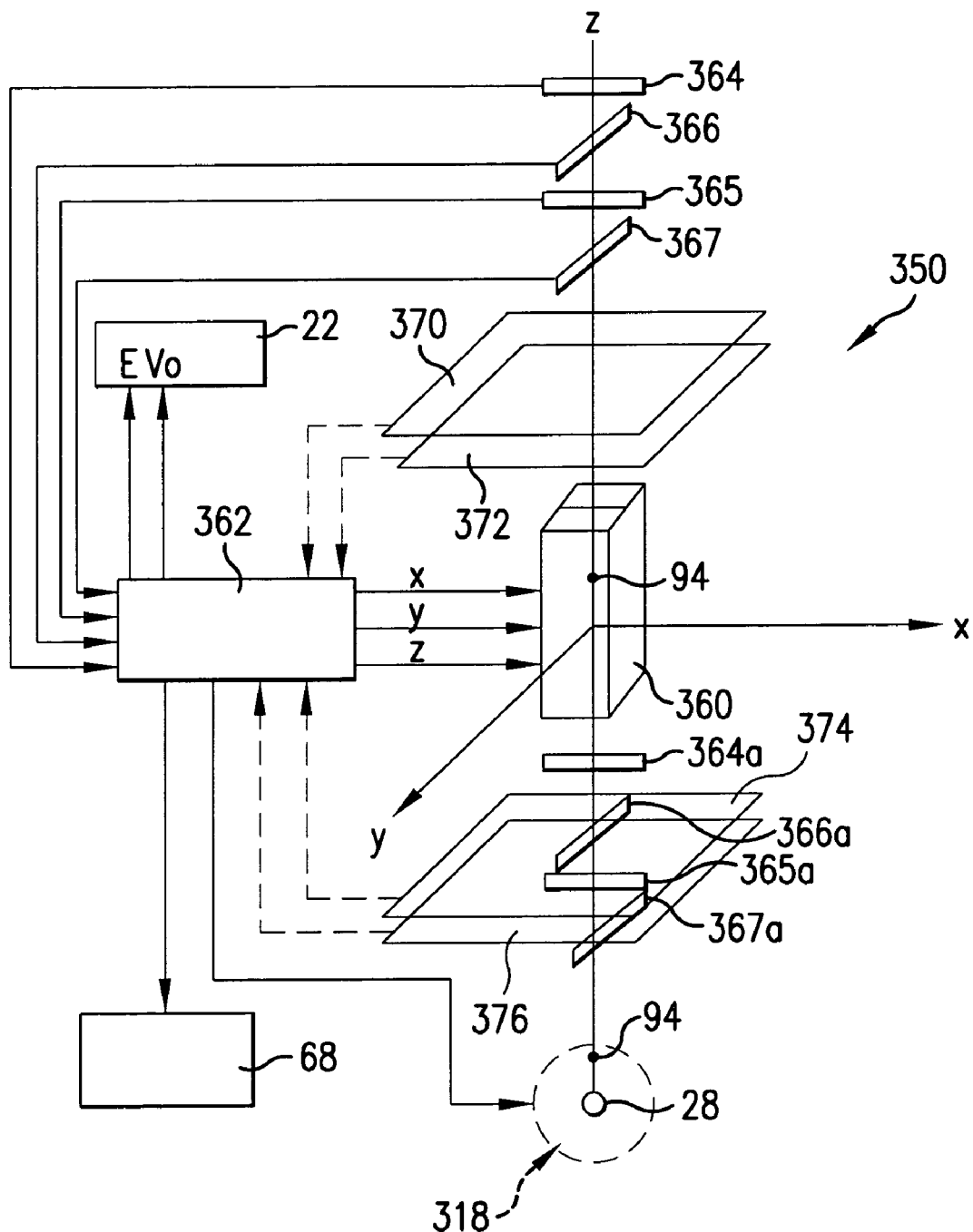
FIG. 9 there is shown a block diagram of an aspect of an embodiment of the present invention regarding feedback and control; and, FIG. 10 shows aspects of an embodiment of the present invention.

It will be understood, that the imaging cameras 70, 72 and 74 may, e.g., be supplemented with a plane crossing detector as discussed above in regard to FIGS. 4A and B or in regard to FIG. 9, or another camera aimed to have a field of view above the ignition point 28 to, e.g., get time of flight information and positioning information for above the ignition site 28, e.g., for calculations of, e.g., trajectory of the target droplet, e.g., near the ignition site 28.

With such an apparatus, e.g., one may be able to form an image of the droplet 94, e.g., formed by a generally circular group of pixels from the array 270 and using suitable image processing software track the "blob" image of the droplet across the array. One skilled in the art of image processing and object tracking will understand that such tracking across three intersecting fields of view, e.g., 270a, 272a and 274a can provide tracking of the droplet 94 before it reaches the ignition site 28, and provide, e.g., information from which an error signal can be generated, e.g., by the feedback controller 62 indicating a position error between the actual position of the target droplet and the target ignition site 28, which may for the given droplet be based on an aiming point for the laser beam 154 for that particular target droplet 94, which may or may not be at some preselected desired ignition point, e.g., at the collector focus, e.g., due to feedback controls, e.g., to the laser aiming system 68, as explained in this application.

It will also be understood that only two cameras could be aimed at the ignition point 28. Further the sensitivity of the cameras, e.g., 70, 72 and 74 could be such that only one pixel at a time is illuminated by the image of the target droplet and/or that the fields of view 270a, 272a and 274a could be very high resolution (low pixel pitch) in order to see the target droplet, and also relatively small in field of view, thus, e.g., decreasing the ability to significantly track the flight of the target droplet, e.g., in the vicinity of the ignition site 28, making the use of detection of the target droplet above the ignition site more important to the overall functioning of the target tracking system 42.

The output of the target tracking system 42 is desired to be information about the target droplet 94, especially at or near the ignition site 28, from which, e.g., the target tracking feedback control system 62 can provide information to the main controller 60 that indicates, e.g., a target droplet position and trajectory at some time prior to reaching the ignition site 28, and e.g., a predicted time of arrival of the detected target droplet 94 at the ignition site 28 and the location at that arrival time in relation to the currently selected aim point for the laser beam 154, so that, e.g., the currently selected aim point may be moved to the predicted point. Also needed may be, e.g., the actual observation of the target droplet arrival at the ignition site and, e.g., the interaction of the laser beam 154 and the particular target droplet 98 at the ignition site 28, and perhaps, also, imaging of any debris departing the ignition site 28. All of the above may then be used by the system, e.g., to generate feedback to, e.g., the main controller 60, such that the main controller 60 may serve to generate control signals to, e.g., modify the target droplet delivery by the target formation/delivery system 24 and/or the positioning of the aim point of the laser beam 154, e.g., by controlling the focusing optics 156, and also, e.g., the timing of the firing of the laser beam 154 at the aim point 28, e.g., by triggering the initial charging of the pulse power system resonant chargers in the magnetic reactor-switched pulse compression and timing circuits 50, 52, for, e.g., the MO and PA laser chambers, and the triggering of the respective firing of the MO and PA chambers, e.g., to deliver the pulse of laser light in beam 154 at the ignition site 28 timed to the arrival also of the target droplet 94. The target droplet 94 and the pulse of laser light 156 must arrive at the particularly designated ignition site 28 for that droplet 94 and that beam 156, with a combined position error of less than about 10 µm, so that the focused pulse 156 of laser light irradiates the entire target droplet 94 without any of the droplet being outside of a spatial distribution of the energy in the pulse 156 that is below some selected level of intensity, in order to avoid, e.g., chunks of metallic debris that will, e.g., pit or coat and optically degrade and/or damage, e.g., reflective surfaces in the EUV light source system 20. The system 20 may, e.g., need to provide a 50 microsecond lead time for triggering the proper firing of the laser 22, particularly if it is a MOPA configuration, e.g., a KrF MOPA, with an accuracy of about 1 microsecond, once every 250 microseconds, e.g., at a 4 KHz repetition rate and once every 100 microseconds for a 10 kHz pulse repetition rate. The droplets 94 will be arriving, e.g., a speed of about 20 meters per second and separated by about 1 mm at a 6 Khz pulse repetition rate.

Since it takes some finite time to generate the laser pulse beam 154 from some occurrence of a triggering signal of some kind, and due to the length of that time, and other factors, e.g., computing time, tracking device and circuitry time, etc. current technologies may not allow for such triggering on a droplet by droplet basis, particularly at higher repetition rates, e.g., at or above 4 kHz. In such event, the detections system 42 and the feedback controllers, e.g., 60, 62 may have to rely, e.g., on timing and position control and the like, e.g., based upon averaging, e.g., droplet positioning and timing information over a series of successive droplets, e.g., the last x number of droplets, and make assumptions about the succeeding droplets continuing to be within, e.g., some relatively slowly varying deviation from the averaged positions so determined. In such a case, the system may still require, e.g., position/timing detection of a given droplet above the ignition site, e.g., for firing control of the laser system 22.

Figure 6:
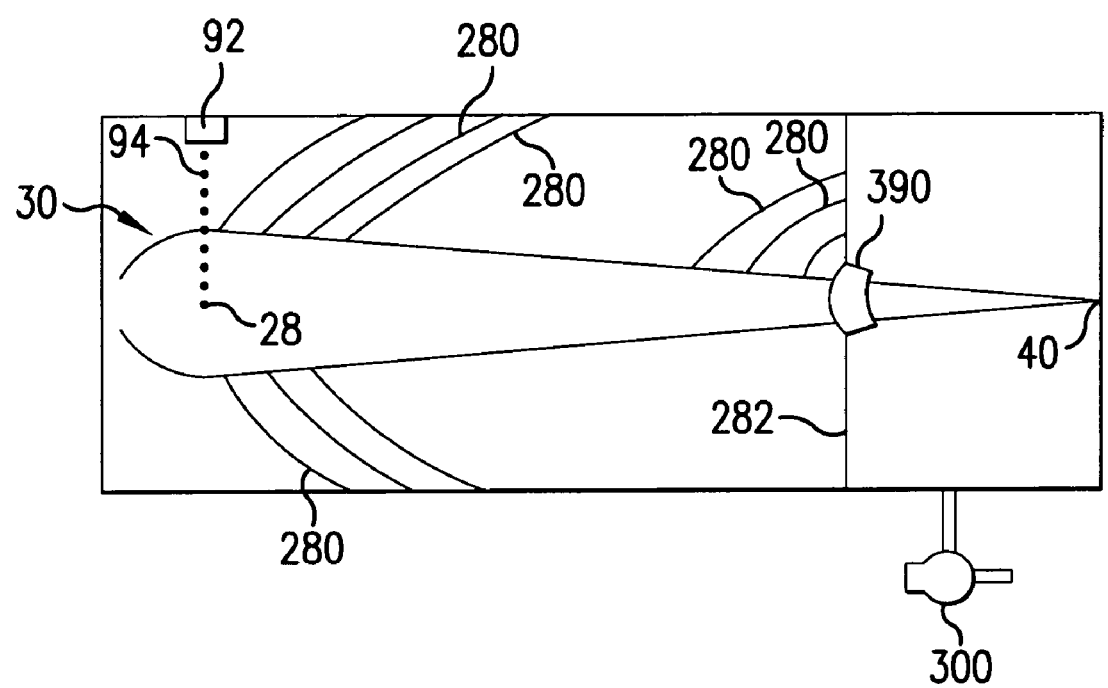
FIG. 6 shows a cross-sectional view according to an aspect of an embodiment of the present invention including cold fingers for debris collection.

Turning now to FIG. 6, there are shown schematically a number of other aspects of embodiments of the present invention, e.g., features including cold fingers 280, pressure interface including a pressure shield 290 and a vacuum pump 300. The cold fingers 280, only some of which are shown, may be comprised of, e.g., magnesium coated copper plates, that may be curved, as shown and may be separated by larger distances more toward the intermediate focus 40 can be water cooled, e.g., with a heat exchanger system (not shown) and also, e.g., with micro-channels inside of the cold fingers 280 (also not shown), e.g., as is done by fusion bonding two pieces together to form each cold finger 280, e.g., as illustrated in U.S. patent application Ser. No. 10/607,407, entitled METHOD AND APPARATUS FOR COOLING MAGNETIC CIRCUIT ELEMENTS, filed on Jun. 25, 2003, assigned to the common assignee of the present application, the disclosure of which is hereby incorporated by reference. These cold fingers, which as partly illustrated schematically in FIG. 6 may extend throughout the vessel 26 except in the cone of the EUV light focused to the intermediate focus all the way or part of the way back to an intermediate wall 282 in the vessel 26. They serve to plate out source atoms that were formed in the plasma or carried with the plasma as it expands from the buffer gas, e.g., argon in the vessel 26, so that these atoms to not plate out on optical surfaces in the EUV light source.

Also shown in FIG. 6 is a possible interface to the exterior of the EUV light source, e.g., outside of the intermediate focus, which may be maintained in a vacuum to limit absorption of EUV light. However, the vacuum in the other portion of the chamber where the EUV light is produced may, for various reasons, need to be maintained at a higher vacuum. The interface may comprise, e.g., an intervening wall 282 and a pressure shield, i.e., a differential pumping trap 290, which may be designed, e.g., to permit the transmittance of the EUV beam to the intermediate focus while maintaining a pressure drop from the portion of the vessel 26 on the one side of the intervening wall 282 that is under pressure, to the other side being maintained at or near a the vacuum by of the enclosure beyond the intermediate focus, e.g., a vacuum pump 300. The differential pressure trap may be constructed similarly to a form of debris shield disclosed in U.S. patent application Ser. No. 10/742,233, filed on Dec. 18, 2003, entitled DISCHARGE PRODUCED PLASMA EUV LIGHT SOURCE, assigned to the common assignee of the present application, the disclosure of which is hereby incorporated by reference. This may be constructed to have channels for the passage of focused EUV light to the intermediate focus, but of sufficiently small size for each channel that the pressure drop across the differential pumping trap can be sustained. To this effect, the differential pumping trap 290 may also be constructed, e.g., by using a section of a sphere of material, e.g., ceramic material and, e.g., focusing a laser through a lens and a meshed screen to drill, e.g., focused passageways through the portion of the sphere to allow the EUV light through, while sustaining the pressure drop, also as disclosed in the above referenced U.S. patent application Ser. No. 10/742,233.

Turning now to FIG. 6 there is shown in more detail aspects of a feedback and control system according to an embodiment of the present invention.

With a full $2\pi$ steradian multi-layer collector, the required electrical input power to the laser for generating the laser to create the plasma can be reduced by 25% due to increasing the geometric collection area from 5 steradians to $2\pi$ steradians. For example, for a KrF excimer based LPP source assuming, e.g., 2.0% laser-to-EUV conversion (based on, e.g., double efficiency with short wavelength), 4% electrical-to-laser conversion, $2\pi$ steradian collection and the same EUV transmission as the TRW/CEO system, the resulting electrical power is 227,272W, which compares well to an alternative approach using discharge produced plasma ("DPP"). For example, $(2.0\%/1.0\%) \cdot (4.0\%/3.0\%) \cdot (2\pi \text{ str}/5 \text{ str}) = 3.3$ leads to this amount of improvement over, e.g., the values shown in the present published TRW/CEO LPP results.

With such possible CE results, one can also estimate the laser power required to meet, e.g., 100 W of EUV light power at the intermediate focus as follows:

| | Single elliptical Collector | Second Spherical Collector[1] | Second Spherical Collector[1] |
|---|---|---|---|
| In-band Power at IF | 100 W | 29 W | 60 W |
| Buffer gas transmission | 0.90 | .90 | 0.90 |
| Power reflected from collector | 111 W | 32 W | 67 W |
| Ave. reflectivity of collector | .50 | $0.60 * 0.50 = 0.30^2$ | $0.60 * 0.50 = 0.30^2$ |
| Power incident on collector | 222 W | 107 W | 222 W |
| Fraction of $2\pi$ sr subtended by collector (5 sr collector) | 0.795 | 0.795 | 0.795 |
| Power emitted into $2\pi$ sr | 279 W | 135 W | 279 W |
| In-band CE for lithium | 0.031 | $0.015^3$ | $0.031^4$ |
| Input laser power | 9,017 W | 9,017 W | 9,017 W |

Notes:
[1] The calculations for the second spherical mirror (columns 2 and 3) start with the input laser power and work upward to see what additional EUV power would be available if a second spherical mirror was added.
[2] Since the radiation reflected by the second spherical mirror must then bounce off the primary elliptical mirror, the effective reflectivity is the product of the two mirrors. The second spherical mirror, since all rays are reflected at normal incidence, was a higher assumed average reflectivity of 60%.
[3] This column assumes that only half as much radiation is emitted in the "backward" direction as compared to the direction toward the incident laser beam.
[4] This column assumes that the emission in the "backward" direction is equal to that in the direction toward the incident laser beam.

Summing the first and second columns one gets 129W of EUV at the IF for 9,017W of laser power, which means, e.g., that one only needs 6,989W of laser power. Doing the same for columns 1 and 3, leads to a conclusion of a requirement for only 5,636W of laser power to reach 100 W at the IF. Its still a lot of laser power, but not in the 20,000–40,000W range, e.g., as described in the results from, e.g., TRW. There is presented a possible economic trade-off between the second spherical mirror and otherwise increased laser power.

Applicants have considered the situation for, e.g., a lithium target/KrF driven LPP, and initially concluded that essentially all of the radiation passed on to the intermediate focus point (simulated in an experiment by a photodiode detector) is either in-band 13.5 nm radiation or UV-Vis radiation. There is no out-of-band EUV, thanks to the use of a multi-layer mirror ("MLM") collector arrangement (also simulated by just a flat MLM). There also appears to be no significant radiation in the region between 40–130 nm. In addition, the conversion efficiency into in-band 13.5 nm radiation appeared to be 4.3 times higher than into the UV-Vis region. However, the requirement seems to be for only 1/100th (1%) as much energy in the 130–400 nm range as the in-band at 13.5 nm, whereas according to applicants' initial experimental measurements the UV-Vis range contains 22% as much energy as the in-band 13.5 nm radiation. However a large portion of this appears to be UV-Vis range to be a strong red line at 670 from neutral lithium, along with other light in the 120 nm–9000 nm range. In addition what was experimentally measured by applicants was radiation from all points around the EUV source point, whereas the true source, e.g., in the configuration contemplated by applicants would have an elliptical imaging mirror and an aperture at the intermediate focus, the latter of which can, e.g., block all radiation from regions away from the EUV source point.

For all LPP systems, e.g., with an MLM primary collector, the 10–40 nm range can be dealt with by the narrow-band reflectivity of the MLM, unlike, e.g., DPP systems, with a grazing incidence collector, where, e.g., all EUV radiation is re-imaged to the intermediate focus and thus this range may be a problem in regard to out of band radiation, without, e.g., a spectral filter, which can, e.g., decrease CE further than operating a system without one, especially for tin and xenon plasma source emission element materials. This may not be true, however for lithium. The same can be said for the 40–130 nm range, because the MLM primary collector in the LPP system also exhibits low reflectivity in this region, but the grazing incidence collector in a DPP could have relatively high reflectivity in the region 40–130 nm.

Between 130 nm and 400 nm, the MLM primary collector is just as reflective as for in-band 13.5 nm radiation, and thus, e.g., the source must emit 100 times less energy in this wavelength range as in-band energy. This restriction is primarily due to the fact that most EUV photoresists are sensitive to this wavelength range as well as 13.5 nm. Though the MLM's in the exposure tool reflect the 400–800 nm range just as well as in-band 13.5 nm, the photoresist is not sensitive and thus only mirror heating is an issue. Thus, the system can tolerate an equal amount in this range as in-band at 13.5 nm. Since MLM's are highly reflective for wavelengths, above 800 nm, but the photoresists are not sensitive to these wavelengths, it would appear that the range above 800 nm would have the same restrictions as the 400–800 nm range. In terms of a YAG-based LPP 1064 nm is included in this last range, and, therefore, 2% conversion efficiency into in-band 13.5 nm can be accompanied by only having 0.001% scattering of the pump laser if that were a requirement for the above 800 nm range.

It is apparent from the above, why CE and in-band CE are so important.

Applicants' experiments have given the following results for solid tin and lithium targets for comparison purposes:

|  | Tin | Lithium |
|---|---|---|
| Laser input energy | 165 mj | 165 mj |
| Total 4π emission from plasma as a percent of input energy (all wavelengths) | 80–88% | 15–20% |
| UV-Visible 4π emission from plasma as a percent of input energy (150 nm to 9000 nm) | 3% | 0.8% |
| EUV 4π emission from plasma as a percent of input energy (Zr filter band, 6.5 nm to 17 nm) | 20–25% | 5–7% |

Figure 7A:
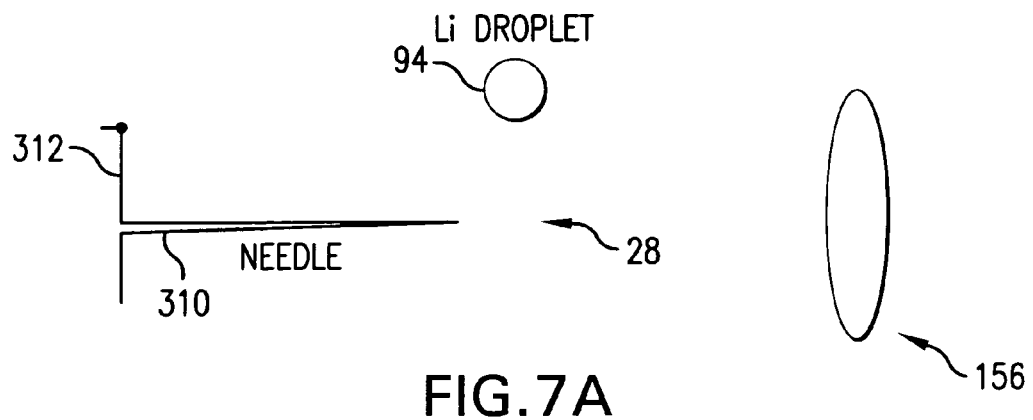
FIGS. 7A–C there is shown an apparatus and method for electrostatically confining a, plasma, e.g., a laser produced plasma according to an aspect of an embodiment of the present invention.
Figure 7B:
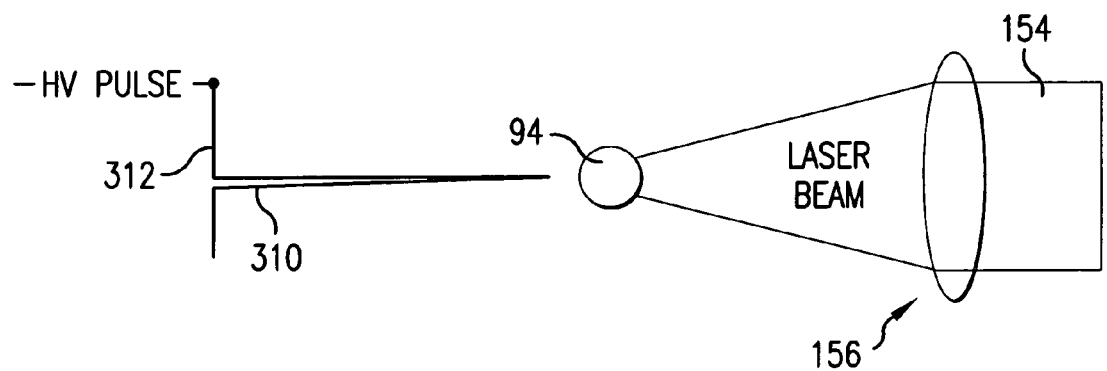
Figure 7C:
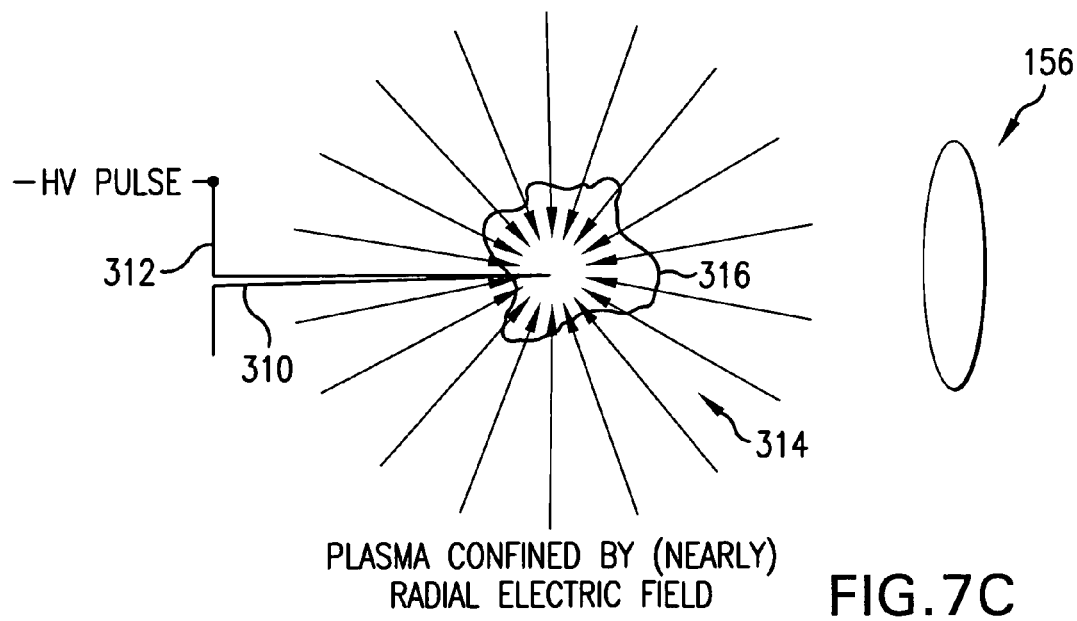

Turning now to FIGS. 7A–C there is shown an apparatus and method for electrostatically confining a, plasma, e.g., a laser produced plasma according to an aspect of an embodiment of the present invention. As shown in FIG. 7A, a thin needle 310 may be provided extending into the vicinity of the ignition site 28. The needle 310 is shown in FIGS. 7A–C to extend from a direction opposite to that of the incoming pulse of laser light 154 passing through the laser beam 154 focusing optic 156, but those skilled in the art will appreciate that this particular orientation is exemplary only and the needle can extend to the illustrated proximity to the ignition site from other orientations as well.

The needle 310 may, e.g., be provided with a source of high voltage, e.g., negative high voltage, 312 and be controlled, e.g., by the overall system controller 60 or, e.g., as part of the laser triggering control, to coordinate the provision of a high negative voltage pulse to the arrival of a target droplet 94 and the laser pulse 154 to the ignition site 28, such that at or just after ignition of the target droplet at the ignition site by irradiation from the laser beam 154, an electrostatic field 314 is formed to confine or assist in confining the plasma 316 produced by the irradiation of the target droplet 94. This may have several beneficial results, e.g., limiting or essentially eliminating plasma produced debris from reaching, e.g., the collector optics, maintaining the plasma sufficiently small to increase ionization of the material of the target droplet thus improving the CE, i.e., helping to maintain plasma density of the plasma 316 all during the irradiation by the laser pulse 154.

The voltage may be, about, e.g., 1000, which should be sufficient for the creation of an electric field capable of keeping ions of an energy of up to about 1 keV, which is in the range of the plasma ions. In addition as the field begins to form, e.g., by the introduction of electrons with negative charge into the needle 310, the positive charges in the plasma due to ionization of the target material may be attracted to the needle to a large enough extent to keep the electrostatic field 314 from ever forming or relatively quickly smothering the electrostatic field 314. To counteract this, applicants propose to provide the voltage supply 312 with a relatively large capacitor, e.g., a bank of capacitors, e.g., in parallel to combine the capacitance to, e.g., e.g., 100 µF or even larger as is possible, so as to relatively quickly dump into the needle 310 enough negative charge to prevent the positively charge ions forming in the plasma from preventing the electrostatic field from performing the intended confinement of the plasma at and after ignition.

Figure 8A:
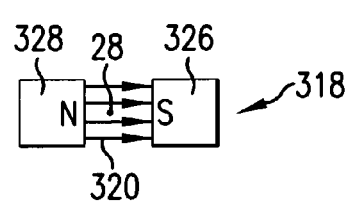
FIGS. 8A–G there is shown schematically aspects of an embodiment of the present invention.
Figure 8B:
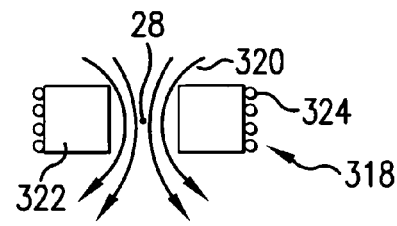
Figure 8C:
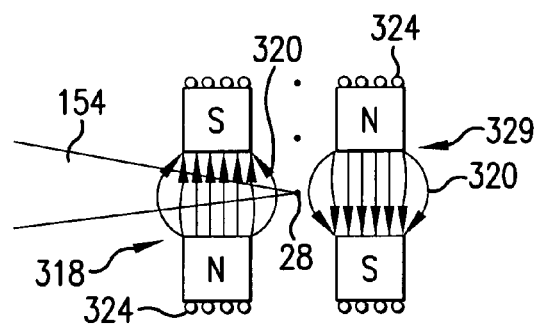

The above description of aspects of an embodiment of the present invention are illustrative only and the claims should not be considered to be limited to the disclosed embodiment(s). Many changes and modification may be made to the disclosed embodiments without departing from the scope and intent of the appended claims. FIG. 8A shows schematically a magnetic apparatus and method to confine the plasma in the vicinity of the ignition site 28 after ignition. FIG. 8A shows the magnetic field 320 set up by, e.g., a pair of bar magnets, 326, 328. FIG. 8B shows magnetic field lines 320 schematically illustrating the magnetic field of a ring magnet 322, which serve to confine a plasma formed at the ignition site 28 when a target is irradiated by a laser bean, e.g., 154 shown in FIG. 8C. FIG. 8B also shows a the use of cooling for the permanent magnet, e.g., a neodymium iron boron magnet or a samarium cobalt magnet, both manufactured, e.g., by Dexter Corporation, under the name of Permag type NdFeB40, and Permag type SmCo22, e.g., a in the form of a ring magnet 322, e.g., using cooling coils 324, e.g., containing flowing cooling fluid, e.g., water. FIG. 8C shows schematically the field 320 set up by a quadrapole arrangement 329.

Figure 8D:
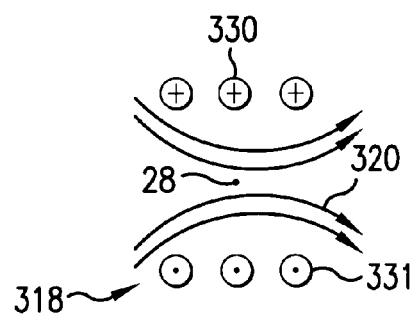
Figure 8E:
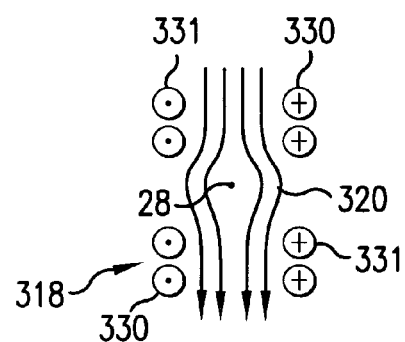
Figure 8F:
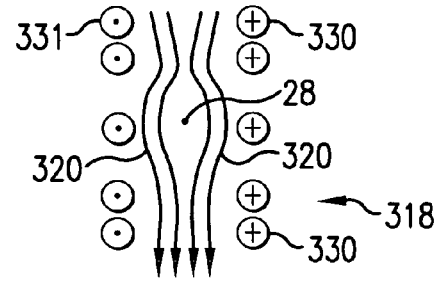
Figure 8G:
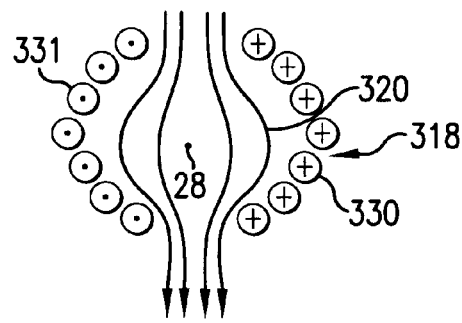

Turning now to FIGS. 8A–G there is shown schematically aspects of an embodiment of the present invention. The magnetic field 320 may also be set up by pulsed current, e.g., as shown in the embodiments of FIGS. 8D–G. In FIG. 8D there is shown a schematic view of the electrical equivalent of the ring magnet of FIG. 8B, e.g., with a magnetic field 320 set up by pulsed current flowing, e.g., through coils of wire indicated by current flowing into the plane of the paper at 330 and out of the plane of the paper at 331. Similarly, FIG. 8E shows an embodiment where a generally bottle shaped magnetic field is set up by distributing the coils along the length of the magnetic field generator so that there are more windings at either end. Similarly in FIG. 8E, this same shaped field 320 can be established, e.g., by alternating the direction of current flow in the coils from one end to the other, i.e., having current flow propagate in one direction through the coil at one end and in the other at the other end, and for a similar purpose a generally spherically shaped coil arrangement can be used, e.g., as shown schematically in FIG. 8G.

By applying a magnetic field in the neighborhood of the ignition site, e.g., of about 1 Tesla in a fashion to create a field in the region of the laser produced plasma the plasma may be at least partially confined, e.g., because plasma expansion can be slowed down, at least in some directions, depending on the magnetic field shape and strength in the vicinity of the respective part of the plasma. This assist in confinement can have several benefits, especially for a moving target of the laser irradiation. For example, the radiating ions will then tend to undergo more radiation cycles and, therefore, emit more radiation. More laser energy can then be converted to radiation rather than, e.g., ion expansion energy resulting in a higher CE of incident laser energy into EUV light.

The magnetic field and the mechanism 318 used to create it can be conveniently arranged to encompass within an appropriate part of the field the ignition site and to allow the target, e.g., a droplet and the irradiation laser beam access to the ignition site. The laser plasma region formed when the laser beam irradiates and ignites the target droplet being in the magnetic field according to an embodiment of the present invention. While typically the field may be about 1 Tesla a range of between about 0.2 and 10 Tesla is contemplated by applicants. The field may be generated using the above noted permanent magnets or in the above described pulsed fashion using, e.g., a high (kilo-ampere) pulsed current through a conducting coil as discussed above. Such a pulse generated magnetic field may be generated, e.g., on a microsecond scale of time and be made to remain essentially constant throughout the time of the irradiation of the target droplet by the incoming laser pulse, e.g., on the order of e.g., several tens of ns. During that time, e.g., the plasma expansion across magnetic field lines is slowed and motion along the field lines is not substantially slowed, the net effect perhaps inducing plasma instabilities which are outweighed, e.g., by increases in CE.

Higher magnetic pressure, e.g., increases the collision frequency in the plasma, which can cause, e.g., a smaller volume hotter plasma than without the magnetic field. Consequently more radiation in the EUV and otherwise is emitted according to the target material and plasma characteristics. One possible embodiment is to use a transverse magnetic, field, e.g., as shown in FIG. 8A. Another is to used a strong ring magnet or magnetic coil around and near the ignition site which can generate, e.g., magnetic field lines along the target droplet propagation path and, e.g., lead to axial confinement in the vicinity of the ignition site 28. A preferred embodiment is a configuration, e.g., as shown in FIGS. 8C, E, F and G, e.g., in which is formed a magnetic trap, e.g., where target ions with traverse (to the target droplet path, illustrated, e.g., in FIG. 8C) are confined.

According to an aspect of an embodiment of the present invention, the magnetic field creation mechanism, e.g., the poles of a permanent magnet, e.g., 326, 328 may have to be relatively close to the LPP, with, e.g., about a 10 mm gap between poles. It may be, e.g., difficult, if not impossible, to create a high enough magnetic field strength, e.g., through long distances between the poles. This need for a close approach component, can, e.g., detract from one of the greatest advantages of the LPP, an absence of electrode erosion, or in this case, e.g., permanent magnet erosion. Applicants have examined, e.g., the nozzle distance for assured positional stability which appears to be on the order of about 50 mm. To mitigate erosion problems with these components, e.g., nozzle and permanent magnets, applicants propose to, e.g., accept erosion but to cause the erosion to be of an acceptable material, e.g., by coating all close-approach elements with, e.g., molybdenum or ruthenium. In this manner, e.g., the eroded material from these components, which might fall on the collector mirror, will not rapidly degrade the mirror reflectivity. Also, e.g., these two materials are expected to have high resistance to sputter by lithium ions.

Turning now to FIG. 9 there is shown a block diagram of an aspect of an embodiment of the present invention regarding feedback and control, providing, e.g., six degrees of feedback and control, i.e., three axis control for steering the target droplets and three axis control for steering the laser. It will be understood that the laser beam may be steered, e.g., utilizing beam pointing and positioning controls, e.g., those used in laser bean delivery units, e.g., as described in application Ser. No. 10/739,961, GAS DISCHARGE LASER LIGHT SOURCE BEAM DELIVERY UNIT, filed on Dec. 17, 2003, Ser. No. 10/712,688, LASER LITHOGRAPHY SOURCE WITH BEAM DELIVERY, filed on Nov. 12, 2003, and Ser. No. 10/425,361, LITHOGRAPHY LASER WITH BEAM DELIVERY AND BEAM POINTING CONTROL, filed on Apr. 29, 2003. FIG. 9 is an illustration schematically and in block diagram format various control loops employed according to aspects of an embodiment of the present invention. There are, e.g., several different actuators that can be utilized in an EUV light source according to aspects of an embodiment of the present invention that can, e.g., be used in a control system configuration. At repetition rates of, e.g., 10 KHz, the droplets will be arriving at one every 100 microseconds, and traveling at about 10–30 m/s, so that the laser beam will have to be time to irradiate a desired target ignition point at the same rate. The laser beam may be focused to be slightly larger than the target droplet, which droplet may be about 10–50 µm in diameter, with some degree of aiming tolerance, e.g., ±10 µm, however the higher the degree of error tolerance embodied in the beam focus size, the lower the power irradiating the droplet target, which decreases in a square function. The droplet, to the extent it continues to move at all during the irradiation period, however, will only move several tenths of a nanometer.

One set of actuators may include, e.g., x and y axis magnetic fields, which may be generated, e.g., by sets of electrodes or coils (not shown), e.g., contained in a target steering and acceleration mechanism 360 used to create magnetic fields which can, e.g., steer a target, e.g., a lithium droplet 94 to the correct intersection point with the laser beam (the desired ignition point). This could be implemented, e.g., with one set of electrodes (not shown), but other implementations might use multiple sets of these to give better trajectory control. In addition there may be a set of electrodes (not shown) that create, e.g., a z axis magnetic field, e.g., used to accelerate the target, e.g., a lithium droplet along the z-axis. It will be understood that this aiming and acceleration function may also be implemented with electric coils arranged in the path of the droplet to deflect the droplet, e.g., towards or away from a respective coil and/or accelerate along the length of a coil. The acceleration and deflection may be magnetic in initiation or electrostatic, as is understood in the art. Target steering may employ techniques such as discussed in M. Orme et al., "Charged molten metal droplet deposition as a direct write technology," MRS Spring Meeting, San Francisco (2001) and Orme et al., "Electrostatic charging and deflection of nonconventional droplet streams formed from capillary stream breakup," Physics of Fluids, Vol. 12, No. 9 (September 2000), pp. 2224–2235, the disclosures of which are hereby incorporated by reference.

The droplets may, e.g., be charged, e.g., by placing a charge ring around the nozzle 220 of the target delivery system 24. Since the droplets are small, the charge distribution over the droplet may be considered to be relatively uniform, however charge will tend to accumulate at points of higher curvature, so that droplet distortions, if any may alter the charge distribution. To account for this, according to an aspect of an embodiment of the present invention, the droplets may be passed through a differential charge analyzer (not shown) intermediate the target delivery system 24 and the steering and acceleration mechanism 360, which may comprise, e.g., a pair of electrodes that deflect the droplet in opposite directions, which the differential in deflection being a measure of charge non-uniformity. This differential in displacement may be detected using detectors (not shown) as discussed in the present application. The amount of charge non-uniformity may be used by the system 350 to control the x and y deflection of the droplet in the steering and acceleration mechanism 360 and z-axis acceleration as well.

According to aspects of an embodiment of the present invention the laser beam system 22, the two chamber excimer laser source containing an MO 44 and a PA 48, could be operated, e.g., in voltage control mode, with the control system 350 controller 362 can, e.g., provide voltage commands to the MO and PA acting as actuators, to regulate the energy out of the EUV source 20. Alternatively, the MOPA 22 could be operated, e.g., in a constant energy mode, in which case, the control system could provide energy commands to the MOPA that could, e.g., be actuators used to regulate the energy out of the EUV source 20. The control system could provide a laser trigger signal to the laser system 22 to act as an actuator providing the laser pulse, in order, e.g., to control the arrival time of the laser pulses at the desired droplet ignition site. As a further alternative the laser may be controlled from the controller 362 by sending, e.g., firing control signals directly to the MOPA TEM utilized in laser timing control systems in MOPA laser products sold by applicants' assignee, e.g., XLA laser models. The voltage control and output energy control signals may be commanded in unison or separately.

Along with and/or in addition to the tracking an position detection sensors discussed above, according to aspects of an embodiment of the present invention, e.g., several different sensors can be made available in the EUV source 20 control system 350 illustrated in FIG. 9, e.g., to be used in a control configuration. By way of example, sets of photo cells, e.g., a first x axis photocell array 364 and a second x axis photocell array 365 and a first y axis photocell array 366 and a second y axis photocell array 367, e.g., may be arranged perpendicular to the droplet path and may be used, e.g., to determine the droplet trajectory, e.g., by determining x and y position of the droplet, e.g., as compared to a predicted x and y axis position at the point of the x and y photocell arrays 364, 366 after leaving the target delivery system 24, or, alternatively, by detecting the x and y positions of the droplet at the arrays 364, 366 and at the arrays 365, 367, and comparing the two, knowing the distance between the two. Neither the x and y photo-arrays 364, 366 not the x and y photocell arrays 365, 367 need to be co-planar, but they may conveniently be so. Another alternative is to use respective arrays to determine droplet arrival time at the sensor 364, 365, 366 and/or 367, which may be used, e.g., as a z plane crossing indication. These detectors 364–367 could be implemented, e.g., by side imaging lasers, as explained above. They may be read, e.g., once per droplet passage, and can provide as an output, e.g., an integrated value of the light detected by each photocell in the array, e.g., over a selected time period, with, e.g., the peak of the inverse of these illumination intensities indicating a location on the photodiode array, which may only be twenty or so photodiodes (pixels) in length, indicative of the position of the center of the droplet in the axis along which the photodiode array is oriented. It will be understood that this peak in the time domain, or perhaps the leading or trailing edge of the spectrum of the integrated signals from the photodiode array may also indicate a z plane crossing time.

In addition, alternatively, e.g., one or more z axis lasers, e.g., a HeNe laser as discussed above can be used, e.g., to measure the time when a droplet crosses the beam, e.g., 370, 372, 374 or 376 which may comprise a planar beam oriented in the plane of the z-axis, i.e., in the direction of transverse to travel of the target, e.g., a droplet of lithium, from the target dispensing system 24 to the ignition site 28. There may, according to aspects of an embodiment of the present invention be multiple such z-axis detection planes, e.g., 370, 372, 374 and 376, e.g., used to control the timing of pulses applied to the magnetic fields, e.g., contained in the droplet steering and acceleration mechanism 360. The magnetic fields could, e.g., be pulsed a fixed interval after the droplet crosses the plane of a respective beam, e.g., 370, 372. Additionally, there could be beams, e.g., 374, 376 positioned closer to the desired ignition point. Crossing this beam 374 could be used, e.g., to cause the lasers system 22 to be triggered at a programmed interval or intervals after beam crossing. The crossings of a plurality of z axis laser planes, e.g., 370, 372 and 374 can also be used, e.g., to determine droplet speed. Detectors 364a, 366a and 365a, 367a may be used, e.g., for trajectory and/or speed detection below the steering and acceleration mechanism 360. It will also be understood that, e.g., only one plane crossing may need to be used for laser triggering and, e.g., the laser control system 64 itself can be used to control the timing between the MO and the PA to effectively deliver a laser pulse to the ignition site 28 timed to arrive concurrently with the target 94, at some defined time interval after such trigger signal, as is well understood in the art of MOPA laser timing control systems.

According to aspects of an embodiment of the present invention, e.g., when a droplet moves through the plane of an x or y axis photocell array, e.g., 364, 366, the voltage cell will produce a voltage pattern on the outputs of the photocells, e.g., indicating a level of light intensity at each individual photocell (not shown) and this information may, e.g., be provided to the controller 362. An algorithm can then be used by the controller 362 to turn this information into a droplet position, e.g., in the x and y planes as noted above. Given state of the art available photocell arrays of affordable cost and acceptable resolution, the algorithm will have to, e.g., achieve measurement precision higher than the pitch of the photocells (not shown) in the array, e.g., 364, 366, as is understood in the field of utilization of such photo-diode arrays in the field of laser wavelength and bandwidth detection. Additionally, according to aspects of an embodiment of the present invention the algorithm may also be able to measure droplet size and droplet deformation, e.g., by utilizing the outputs of the x, y detectors, e.g., 364, 366, e.g., to detect droplet width in two axes.

According to an aspect of an embodiment of the present invention there may be, e.g., two possible stages of position control. In the first stage, x and y photocell arrays 364, 366, 365, 367, may be used, e.g., to determine the z plane position of the droplet prior to entering the x and y axis magnetic field electrodes in the droplet steering and acceleration mechanism 360, along with the droplet trajectory. This information may then be used by the control system 362 to, e.g., adjust the sizes of the fields applied at the electrodes (not shown), e.g., for the current droplet and perhaps also for the next subsequent droplet. In a second stage, e.g., x and y photocell arrays 364a, 366a may be used, e.g., to determine the position of the droplet after it has passed through the x and y axis magnetic fields in the droplet steering and acceleration mechanism, and, e.g., just prior to intersection with the laser beam at the desired ignition site. This information may, e.g., be used to adjust the x and y magnetic fields, e.g., for successive shots, e.g., to adjust for any position error in the droplet previously arriving at the ignition site.

The z-axis laser plane detectors 374, 376 or the x and y axis photocell arrays, 364a and 366a, and 365a and 367a, or a combination thereof may also be used, e.g., to determine the droplet speed and trajectory, e.g., after leaving the Z-axis magnetic field in the droplet steering and acceleration mechanism 360. This can then be used, e.g., to adjust the z-axis magnetic fields for successive targets, e.g., based upon detected target position/speed error for a droplet in a prior shot arriving at the desired ignition site. In addition, e.g., a pair detectors (not shown), e.g., only including a single photo-diode element (pixel) may be illuminated by a respective pair of beans one passing through a point at or very near the desired target ignition site and one just above that, e.g., to detect target speed as close to the desired target ignition site as possible, e.g., by the leading edge of the droplet blocking each of these two respective detectors (not shown). This may be used, e.g., to indicate speed changes occurring in the target droplets at or very near the desired target ignition site, e.g., due to influences of the creation of a plasma by ignition of a prior droplet target, magnetic field influences or the like.

A dither may also, e.g., be is applied to the energy setpoint for, e.g., the excimer target irradiating laser. The dither signal can be either random or periodic. The dither may, e.g., be correlated with the EUV output energy to determine the sensitivity of EUV output to the energy output of the plasma forming laser. This information may be used, e.g., to scale the commands in the plasma forming laser energy control loop to keep the loop gain constant.

According to an aspect of an embodiment of the present invention there may be two laser systems 22 each providing a laser pulse to the desired ignition site, time to arrive simultaneously, in which event, arrival time of each laser pulse to a point just prior to droplet intersection may be measured. This value may, e.g., be used to adjust the trigger time of each laser relative to the droplet crossing the final z-axis laser beam plane. Also in the case of the use of two lasers 22, independent dither signals may be applied to the trigger times of each of the excimer lasers 22. These dithers may be correlated with the EUV output, e.g., in order to determine the sensitivity of the EUV energy to the trigger time of each excimer laser. The trigger time of each excimer laser may then independently adjusted to drive the sensitivity to zero and thus maximize EUV efficiency.

According to another aspect of an embodiment of the present invention the above mentioned sensors may be used to determine a target position and trajectory and to predict a desired ignition site in the possible paths of the laser pulse and provide feedback to control either the aiming of the laser 22 into the laser positioning and focusing optics (not shown) or the aiming of the laser positioning and focusing optics (not shown) or utilizing beam pointing as discussed above, for purposes of causing an intersection and irradiation of the respective droplet by the laser beam pulse at a predicted desired intersection point (predicted desired ignition site), which, e.g., may be different from a prior ignition site, but still within an acceptable distance from the focus of the collector 30 to not significantly detract from the collected EUV light. This may also be done in a relatively slow feedback loop, i.e., not on a shot by shot basis, to correct for system indications of a slow drift of the average arrival time and position at the target ignition site. Thus over time, e.g., due to changes in the operating environment within the vessel, e.g., buffer gas pressure, the desired target ignition site may move slightly, staying within, e.g., about a ±10 µm position error from the focus of the collector 30 and still generate EUV light at acceptable levels. The system just described may be used to detect this change over time and to redirect the focus of the laser to the new desired target ignition point, assuming that the steering mechanism due to environmental changes is not able on average to direct the target droplets to the original target ignition point, e.g., at the focus of the collector 30.

Target delivery may also be accomplished utilizing techniques such as those disclosed in U.S. application Ser. No. 10/409,254, EXTREME ULTRAVIOLET LIGHT SOURCE, filed on Apr. 8, 2003, the disclosure of which is hereby incorporated by reference.

Figure 10:
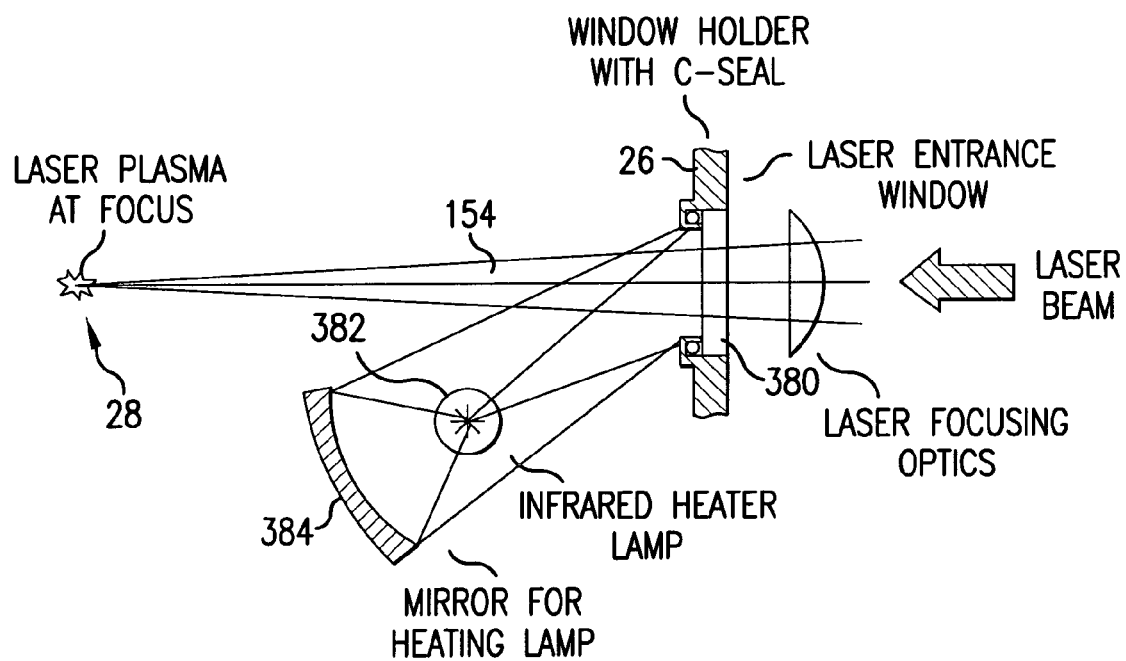

Turning now to FIG. 10 there is shown aspects of an embodiment of the present invention comprising an input window 380 formed in a wall of the chamber vessel 26 and through which the laser bean 146 enters to reach the ignition point 28. The window 380 may be, e.g., heated to, e.g., remove, e.g., by evaporation debris that plates onto the window, e.g., lithium, tin or xenon atoms from the plasma. The window 380 may be heated, e.g., by a heating element, e.g., by use of an external heating fixture attached to the metal body of the window 380 mounting flange or a heat lamp 382, e.g., an infrared heat lamp, which may, e.g., be reflected onto the window 380 by a mirror 384. The 384, as is shown in FIG. 10, may, e.g., be facing away from the laser plasma in order to avoid that mirror 384 surface being in a direct line of sight to the plasma. This can, e.g., prevent particle impact from the plasma onto this mirror 384 reflective surface.

Those skilled in the art will appreciate that many modifications and changes may be made to the above described aspects of embodiments of the present invention and the appended claims should not be interpreted to be limited only to the disclosed embodiments, but to include such embodiments and equivalents thereof.

We claim:

1. An EUV light source comprising:
   a pulsed laser providing laser pulses at a selected pulse repetition rate focused at a desired plasma formation site;
   a target formation system providing discrete targets at a selected interval coordinated with the laser pulse repetition rate;
   a target steering system intermediate the target formation system and the desired plasma formation site;
   a target tracking system providing information about the movement of target between the target formation system and the target steering system, enabling the target steering system to direct the target to the desired plasma formation site.

2. The apparatus of claim 1 further comprising:
   the target tracking system providing information enabling the creation of a laser firing control signal.

3. The apparatus of claim 2 further comprising:
   the target tracking system comprising:
   a droplet detector comprising a collimated light source directed to intersect a point on a projected delivery path of the target, having a respective oppositely disposed light detector detecting the passage or the target through the respective point.

4. The apparatus of claim 3 further comprising:
   the droplet detector comprising a plurality of droplet detectors at least one of droplet detectors comprising a plane-intercept detection device.

5. The apparatus of claim 3 further comprising:
   the droplet detector comprises a plurality of droplet detectors each operating at a different light frequency.

6. The apparatus of claim 2 further comprising:
   the target tracking system comprising:
   a droplet detector comprising a collimated light source and a detector comprising a linear array of a plurality of photo-sensitive elements aligned to a coordinate axis, the light from the light source intersecting a projected delivery path of the target.

7. The apparatus of claim 6 further comprising:
   the droplet detector comprising a plurality of droplet detectors at least one of droplet detectors comprising a plane-intercept detection device.

8. The apparatus of claim 2, further comprising:
   the target tracking system comprising:
   a droplet detector comprising a camera having a field of view and a two dimensional array of pixels imaging the field of view.

9. The apparatus of claim 1 further comprising:
the target tracking system comprising:
a droplet detector comprising a collimated light source directed to intersect a point on a projected delivery path of the target, having a respective oppositely disposed light detector detecting the passage or the target through the respective point.

10. The apparatus of claim 9 further comprising:
the droplet detector comprising a plurality of droplet detectors at least one of droplet detectors comprising a plane-intercept detection device.

11. The apparatus of claim 9 further comprising:
the droplet detector comprises a plurality of droplet detectors each operating at a different light frequency.

12. The apparatus of claim 1 further comprising:
the target tracking system comprising:
a droplet detector comprising a collimated light source and a detector comprising a linear array of a plurality of photo-sensitive elements aligned to a coordinate axis, the light from the light source intersecting a projected delivery path of the target.

13. The apparatus of claim 12 further comprising:
the droplet detector comprising a plurality of droplet detectors at least one of droplet detectors comprising a plane-intercept detection device.

14. The apparatus of claim 1, further comprising:
the target tracking system comprising:
a droplet detector comprising a camera having a field of view and a two dimensional array of pixels imaging the field of view.

15. An EUV light source comprising:
a pulsed laser means for providing laser pulses at a selected pulse repetition rate focused at a desired plasma formation site;
a target formation means for forming discrete targets at a selected interval coordinated with the laser pulse repetition rate;
a target steering means intermediate the target formation means and the desired plasma formation site;
a target tracking means for providing information about the movement of target between the target formation means and the target steering means, and for enabling the target steering means to direct the target to the desired plasma formation site.

16. The apparatus of claim 15 further comprising:
the target tracking means including means for providing information enabling the creation of a laser firing control signal.

17. The apparatus of claim 16 further comprising:
the target tracking means comprising:
a droplet detector comprising a collimated light source directed to intersect a point on a projected delivery path of the target, having a respective oppositely disposed light detector detecting the passage of the target through the respective point.

18. The apparatus of claim 17 further comprising:
the droplet detector comprising a plurality of droplet detectors at least one of droplet detectors comprising a plane-intercept detection device.

19. The apparatus of claim 17 further comprising:
the droplet detector comprises a plurality of droplet detectors each operating at a different light frequency.

20. The apparatus of claim 16 further comprising:
the target tracking means comprising:
a droplet detector comprising a collimated light source and a detector comprising a linear array of a plurality of photo-sensitive elements aligned to a coordinate axis, the light from the light source intersecting a projected delivery path of the target.

21. The apparatus of claim 20 further comprising:
the droplet detector comprising a plurality of droplet detectors at least one of droplet detectors comprising a plane-intercept detection device.

22. The apparatus of claim 16, further comprising:
the target tracking means comprising:
a droplet detector comprising a camera having a field of view and a two dimensional array of pixels imaging the field of view.

23. The apparatus of claim 15 further comprising:
the target tracking means comprising:
a droplet detector comprising a collimated light source directed to intersect a point on a projected delivery path of the target, having a respective oppositely disposed light detector detecting the passage of the target through the respective point.

24. The apparatus of claim 23 further comprising:
the droplet detector comprising a plurality of droplet detectors at least one of droplet detectors comprising a plane-intercept detection device.

25. The apparatus of claim 23 further comprising:
the droplet detector comprises a plurality of droplet detectors each operating at a different light frequency.

26. The apparatus of claim 15 further comprising:
the target tracking means comprising:
a droplet detector comprising a collimated light source and a detector comprising a linear array of a plurality of photo-sensitive elements aligned to a coordinate axis, the light from the light source intersecting a projected delivery path of the target.

27. The apparatus of claim 26 further comprising:
the droplet detector comprising a plurality of droplet detectors at least one of droplet detectors comprising a plane-intercept detection device.

28. The apparatus of claim 15, further comprising:
the target tracking means comprising:
a droplet detector comprising a camera having a field of view and a two dimensional array of pixels imaging the field of view.

29. An EUV light producing method comprising:
utilizing a pulsed laser, providing laser pulses at a selected pulse repetition rate focused at a desired plasma formation site;
forming discrete targets at a selected interval coordinated with the laser pulse repetition rate;
utilizing a target steering system intermediate the formation of the target and the desired plasma formation site;
utilizing a target tracking system providing information about the movement of target between the target formation and the target steering system, and for enabling the target steering system to direct the target to the desired plasma formation site.

30. The method of claim 29 further comprising:
utilizing the target tracking system, providing information enabling the creation of a laser firing control signal.

31. The method of claim 30 further comprising:
the target tracking system comprising:
a droplet detector comprising a collimated light source directed to intersect a point on a projected delivery path of the target, having a respective oppositely disposed light detector detecting the passage or the target through the respective point.

32. The method of claim 31 further comprising:
at least one of droplet detectors comprises a plane-intercept detection device.

33. The method of claim 31 further comprising:
the droplet detector comprises a plurality of detectors detectors each operating at a different light frequency.

34. The method of claim 30 further comprising:
the target tracking system comprising:
a droplet detector comprising a collimated light source and a detector comprising a linear array of a plurality of photo-sensitive elements aligned to a coordinate axis, the light from the light source intersecting a projected delivery path of the target.

35. The method of claim 34 further comprising:
at least one of droplet detectors comprises a plane-intercept detection device.

36. The method of claim 30, further comprising:
the target tracking system comprising:
a droplet detector comprising a camera having a field of view and a two dimensional array of pixels imaging the field of view.

37. The method of claim 29 further comprising:
the target tracking system comprising:
a droplet detector comprising a collimated light source directed to intersect a point on a projected delivery path of the target, having a respective oppositely disposed light detector detecting the passage of the target through the respective point.

38. The method of claim 37 further comprising:
at least one of droplet detectors comprises a plane-intercept detection device.

39. The method of claim 37 further comprising:
the droplet detector comprise a plurality of droplet detectors each operating at a different light frequency.

40. The method of claim 29 further comprising:
the target tracking system comprising:
a droplet detector comprising a collimated light source and a detector comprising a linear array of a plurality of photo-sensitive elements aligned to a coordinate axis, the light from the light source intersecting a projected delivery path of the target.

41. The method or claim 40 further comprising:
at least one of droplet detectors comprises a plane-intercept detection device.

42. The method of claim 29, further comprising:
the target tracking system comprising:
a droplet detector comprising a camera having a field of view and a two dimensional array of pixels imaging the field of view.

* * * * *